United States Patent
Chopra

(10) Patent No.: US 9,191,025 B1
(45) Date of Patent: Nov. 17, 2015

(54) SEGMENTED DIGITAL-TO-ANALOG CONVERTER

(71) Applicant: STMICROELECTRONICS INTERNATIONAL N.V., Schiphol (NL)

(72) Inventor: Anubhuti Chopra, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/502,360

(22) Filed: Sep. 30, 2014

(51) Int. Cl.
  *H03M 1/66* (2006.01)
  *H03M 1/68* (2006.01)
  *H03M 1/06* (2006.01)
  *H03M 1/12* (2006.01)
  *H03M 1/46* (2006.01)
  *H03M 3/00* (2006.01)

(52) U.S. Cl.
  CPC ............ *H03M 1/687* (2013.01); *H03M 1/0626* (2013.01); *H03M 1/1245* (2013.01); *H03M 1/462* (2013.01); *H03M 3/464* (2013.01)

(58) Field of Classification Search
  CPC ..... H03M 3/338; H03M 1/687; H03M 3/464; H03M 1/462; H03M 1/0626; H03M 1/1245
  USPC ......................................... 341/143–145, 155
  See application file for complete search history.

(56) References Cited

U.S. PATENT DOCUMENTS

| | | | | |
|---|---|---|---|---|
| 4,292,625 A * | 9/1981 | Schoeff | .................. | H03M 1/00 341/145 |
| 5,703,586 A * | 12/1997 | Tucholski | ........... | H03M 1/1047 341/118 |
| 5,870,044 A * | 2/1999 | Dell'ova | ............. | H03M 1/1004 341/120 |
| 5,933,107 A * | 8/1999 | Tan | ...................... | H03M 1/0614 341/144 |
| 5,977,899 A | 11/1999 | Adams | | |
| 6,037,888 A * | 3/2000 | Nairn | ..................... | H03M 1/687 341/145 |
| 6,583,744 B2 * | 6/2003 | Bright | ................. | H03M 1/0604 341/118 |
| 6,650,265 B1 * | 11/2003 | Bugeja | .................. | H03M 1/002 341/131 |
| 6,906,652 B2 * | 6/2005 | Bugeja | ................ | H03M 1/0643 341/145 |
| 7,026,971 B2 * | 4/2006 | Horsky | ................. | H03M 1/682 341/145 |

* cited by examiner

Primary Examiner — Khai M Nguyen
(74) Attorney, Agent, or Firm — Gardere Wynne Sewell LLP

(57) ABSTRACT

In an embodiment, a digital-to-analog converter (DAC) converts an input digital signal into an output analog signal, and includes first and second segments, a combiner, and a controller. The first segment includes a first number of first elements that are configured to generate a first analog signal in response to a first portion of the digital signal, and the second segment includes a second number of second elements that are configured to generate a second analog signal in response to a second portion of the digital signal. The combiner is configured to combine the first analog signal and the second analog signal to generate the output analog signal, and the controller is configured to deactivate one of the first elements and to activate one of the second elements in place of the deactivated first element. For example, such a segmented DAC may be suitable for use in a sigma-delta ADC.

44 Claims, 14 Drawing Sheets

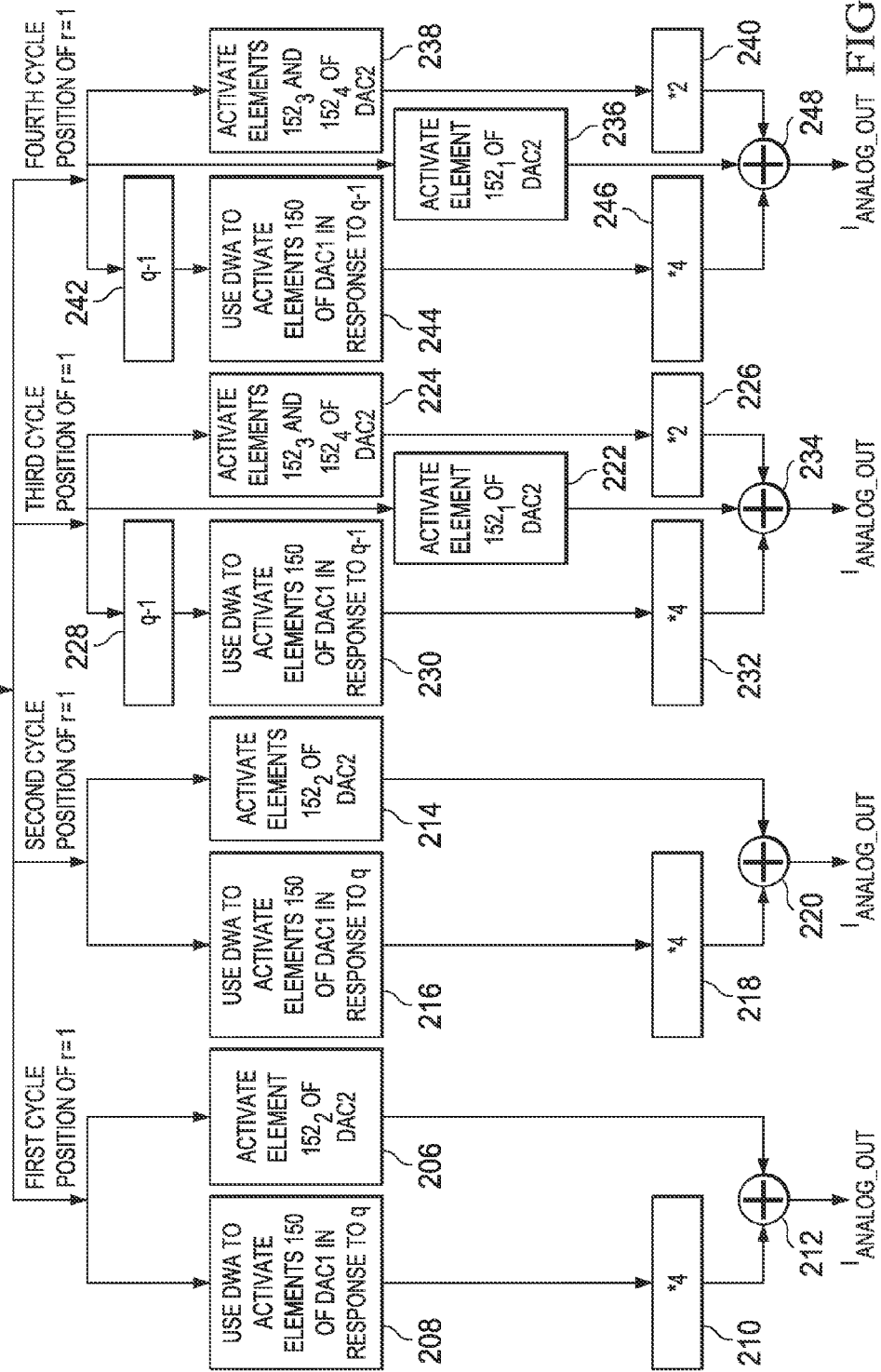

SEGMENTED DIGITAL-TO-ANALOG CONVERTER

TECHNICAL FIELD

The present disclosure relates generally to electronic circuits and signal processing, and more specifically to a segmented digital-to-analog converter (DAC), and to a sigma-delta analog-to-digital (ADC) converter that includes a segmented DAC in a feedback path of the ADC.

SUMMARY

In an embodiment, a segmented digital-to-analog converter (DAC) converts an input digital signal into an output analog signal, and includes first and second segments, a combiner, and a controller. The first segment includes a first number of first elements that are configured to generate a first analog signal in response to a first portion of the digital signal, and the second segment includes a second number of second elements that are configured to generate a second analog signal in response to a second portion of the digital signal. The combiner is configured to combine the first analog signal and the second analog signal to generate the output analog signal, and the controller is configured to deactivate at least one of the first elements and to activate at least one of the second elements in place of the deactivated at least one of the first elements.

For example, such a segmented digital-to-analog converter (DAC) may be suitable for use in a feedback path of a sigma-delta analog-to-digital converter (ADC). Such an ADC may have a signal-to-noise ratio (SNR) of 100 decibels (dB) or higher, yet may have fewer components, and thus may occupy less area, than a conventional ADC having a comparable SNR.

BRIEF DESCRIPTION OF THE DRAWINGS

FIGS. 11A-11D are diagrams of the operation of the 6-bit version of the segmented DAC of FIGS. 7 and 10, according to an embodiment.

DETAILED DESCRIPTION

Figure 1:
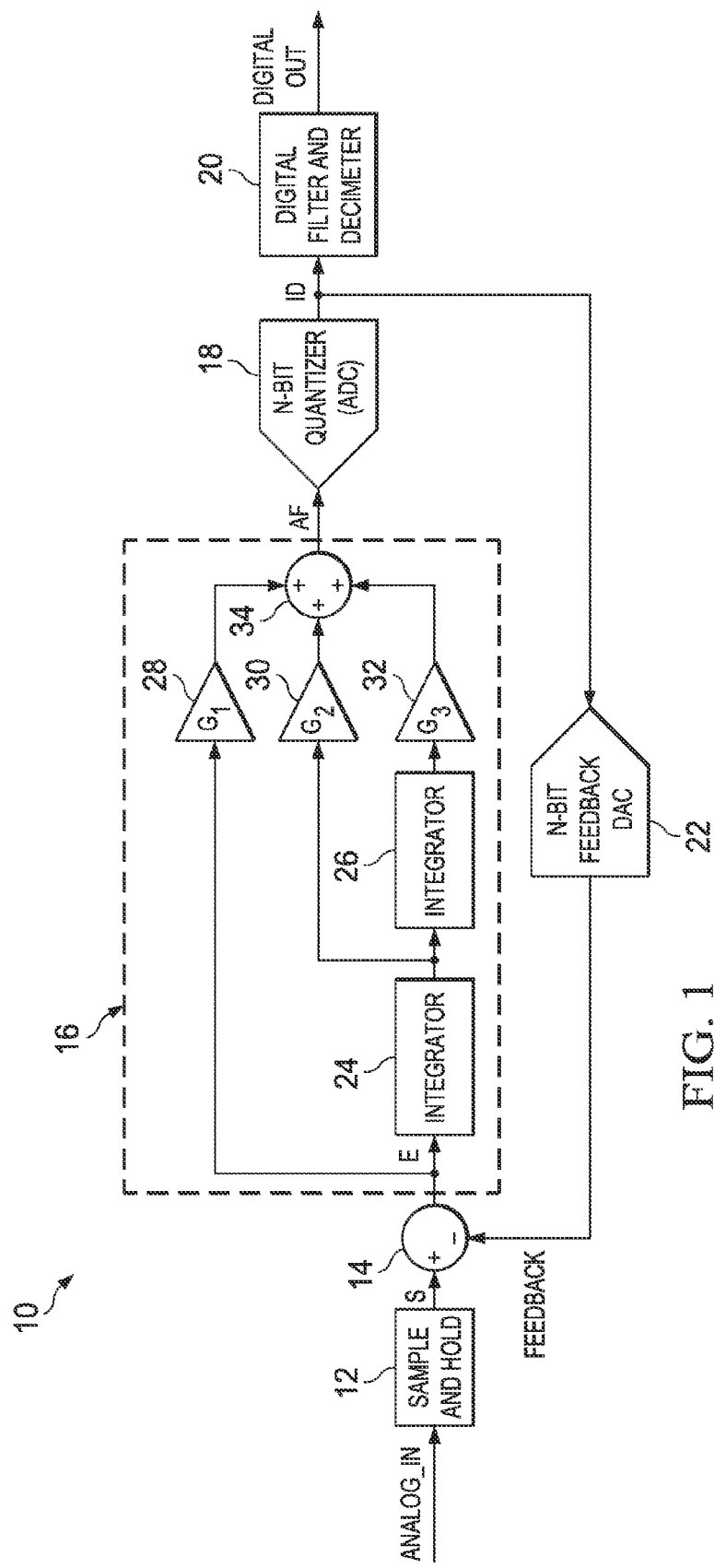
FIG. 1 is a diagram of a sigma-delta analog-to-digital converter (ADC) that includes a digital-to-analog converter (DAC) in a feedback path.

FIG. 1 is a diagram of a sigma-delta analog-to-digital converter (ADC) 10.

In general, the sigma-delta ADC 10 oversamples an input analog signal ANALOG_IN, and converts the oversampled analog signal ANALOG_IN into an output digital signal DIGITAL_OUT having a sample rate that is lower than the oversampling rate; for example, the sample rate may be at or near the Nyquist frequency, and the oversampling rate may be 128 times the sample rate. The sigma-delta ADC 10 can have relatively low complexity and cost, and can occupy a relatively small area, and yet provide a digital output signal having a relatively high resolution (e.g., 16-24 bits), high signal-to-noise ratio (SNR), and high linearity, as compared to other types of ADCs (e.g., flash, successive approximation) of comparable resolution.

The sigma-delta ADC 10 includes a sample-and-hold (SAH) circuit 12, a combiner (an adder in the described embodiment) 14, a loop filter 16, an N-bit quantizer (e.g., a flash ADC) 18, a filter and decimator 20, and an N-bit feedback DAC 22. And the loop filter 16 includes two integrators 24 and 26, three amplifiers 28, 30, and 32 having respective gains G1, G2, and G3, and a combiner (an adder in the described embodiment) 34. Because the loop filter 16 includes two integrators 24 and 26, the ADC 10 may be referred to as a second-order sigma-delta ADC.

Still referring to FIG. 1, the operation of the sigma-delta ADC 10 is described.

The SAH circuit 12 oversamples the analog input signal ANALOG_IN at an oversampling rate that is significantly higher (e.g., 128 times higher) than the Nyquist frequency, which is twice ANALOG_IN'S highest frequency component of interest.

During a sampling period, the SAH circuit 12 generates an analog sample S of the input analog signal ANALOG_IN, and the combiner 14 subtracts from this analog sample S an analog feedback signal FEEDBACK to generate an analog difference, or error, signal E.

The filter 16 filters the analog difference signal E, and the quantizer 18 converts the analog filtered signal AF into an intermediate digital signal ID having a resolution (e.g., 2-6 bits) that is significantly less than the resolution (e.g., 16-24 bits) of the output digital signal DIGITAL_OUT. Because circuitry within filter 16 may exhibit significant non-linear behavior at the upper and lower limits of its input range, the quantizer 18 may limit its output range to prevent such non-linear behavior. For example, if the quantizer 18 is a 5-bit quantizer, then instead of generating the signal ID over the full range of 0 to 31, it may limit the range of ID to 4 to 29; similarly, if the quanitzer is a 6-bit quantizer, then, instead of generating the signal ID over the full range of 0 to 63, it may limit the range of ID to 6 to 58.

The filter and decimator 20 decreases the sample rate, and increases the resolution, of the intermediate digital signal ID to generate the digital output signal DIGITAL_OUT.

And the N-bit feedback DAC 22 converts the intermediate digital signal ID into the analog feedback signal FEEDBACK, and provides FEEDBACK to the combiner 14.

The SAH circuit 12, combiner 14, loop filter 16, N-bit quantizer 18, filter and decimator 20, and N-bit feedback DAC 22 repeat the above-described operational sequence for each subsequent sample S of the input analog signal ANALOG_IN.

Still referring to FIG. 1, alternate embodiments of the ADC 10 are contemplated. For example, the loop filter 16 may have an architecture that is different from that described.

A potential problem with the sigma-delta ADC 10 of FIG. 1 is that the output digital signal DIGITAL_OUT may have a signal-to-noise ratio (SNR) that is too low for some applications.

For example, if the DAC 22 is a 4-bit DAC, the OSR is 128, and the required SNR of the ADC 10 is 100 dB, then the linearity of the DAC needs to be better than 1 part in 100000/128 because the DAC non-linearity directly adds with the ADC input signal ANALOG_IN. Achieving such a high level of linearity for a standard 4-bit DAC 22 may be difficult, and would probably increase the cost and complexity of the DAC 22 significantly.

Consequently, to insure that the feedback DAC 22 is linear, the sigma-delta ADC 10 may include a 1-bit quantizer 18 and a 1-bit feedback DAC 22 (i.e., N=1). It is known that a 1-bit DAC is inherently linear, and that a linear feedback DAC will not add non-linear distortion to the input samples S, and, therefore, will not add non-linear distortion to the ADC output signal DIGITAL_OUT.

But a potential problem with the ADC 10 including a 1-bit quantizer 18 and a 1-bit feedback DAC 22 is that the power of the quantization noise may be too high for some applications. Even though the filter and decimator 20 may filter out the quantization noise per above, the power that the ADC 10 consumes to generate the quantization noise is effectively wasted because it is removed from DIGITAL_OUT.

And another potential problem with the ADC 10 including a 1-bit quantizer 18 and a 1-bit feedback DAC 22 is that the stability margin for the loop formed by the combiner 14, filter 16, quantizer 18, and feedback DAC 22 may be too low for some applications.

To overcome the problems of the quantization-noise power being too high and the stability margin for the loop being too low, the sigma-delta ADC 10 may include a multi-bit (e.g., 4≤N≤6) quantizer 18 and a multi-bit (e.g., 4≤N≤6) feedback DAC 22.

But unfortunately, a multi-bit DAC 22 may have a non-linear output, and therefore, may add non-linear distortion to the input samples S and to the ADC output signal DIGITAL_OUT. And such non-linear distortion may be characterized as noise that reduces the SNR of DIGITAL_OUT.

Figure 2:
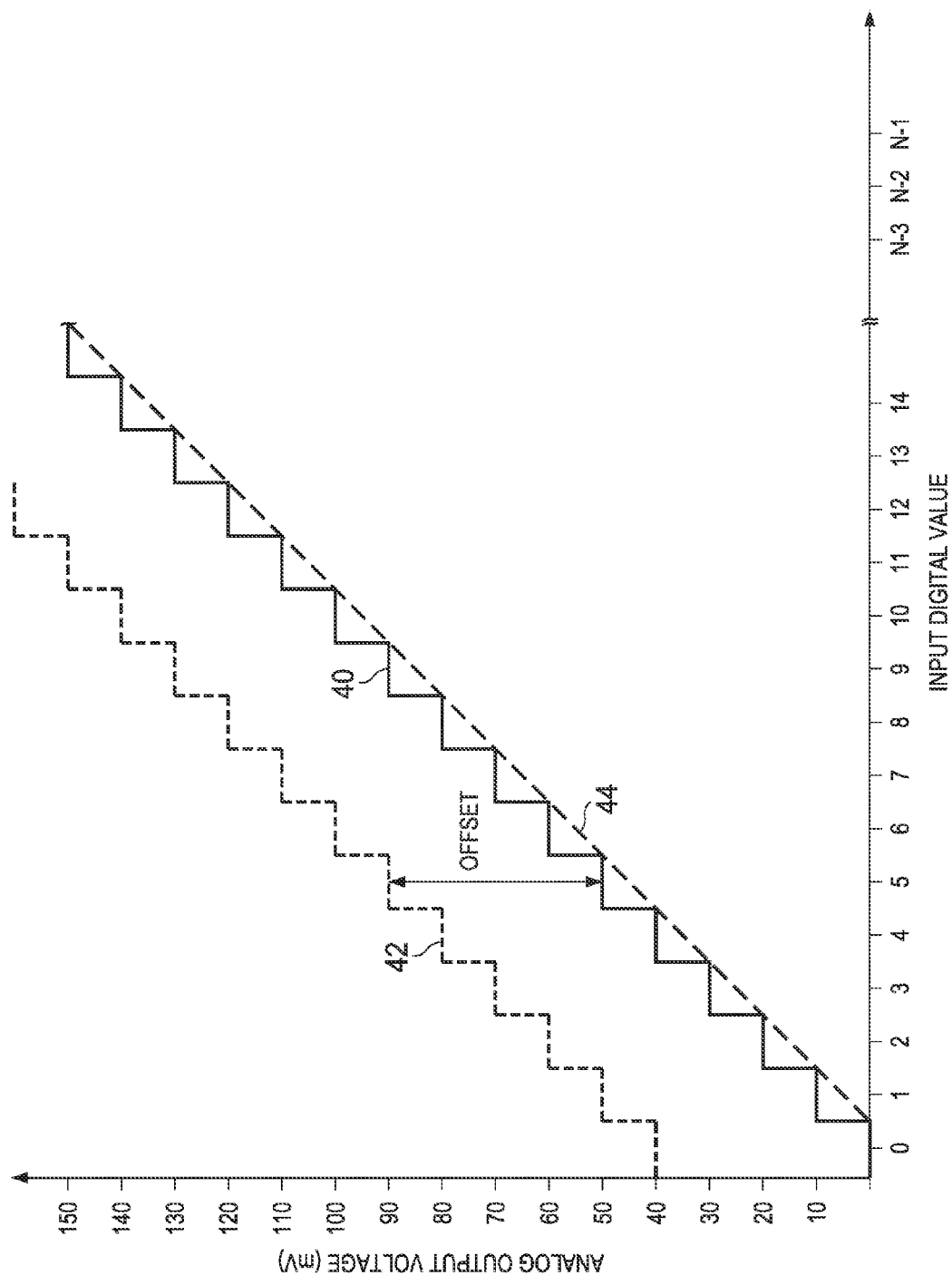
FIG. 2 is plot of the digital input versus the analog output of a linear DAC for two levels of output offset.

FIG. 2 is a plot of analog output signals 40 and 42 generated by respective linear versions of the DAC 22 of FIG. 1 in response to a linearly ramping digital input signal. The output signal 40 is generated by a linear, multi-bit first version of the DAC 22 having zero output offset, and the output signal 42 is generated by a linear, multi-bit second version of the DAC having a non-zero output offset.

The analog output signal 40 is linear because the gain of the first version of the DAC 22 is constant regardless of the value of the digital input signal. For example, for an input value of 8, the analog output signal 40 has a value of 80 millivolts, for a gain of 80/8=10 mV/(least significant-bit (LSB)). Similarly, for an input value of 12, the analog output signal 40 has a value of 120 mV, also for a gain of 120/12=10 mV/LSB. The straight dashed line 44 through the same respective point of each step of the analog output signal 40 shows that the gain of the first version of the DAC 22 is a constant 10 mV/LSB for the entire range of digital input values.

Furthermore, the first version of the DAC 22 has a zero output offset because the analog output signal 40 equals zero for an input value of 0. Or, stated differently, the first version of the DAC 22 has a zero output offset because the plot of the analog output signal 40 intercepts the y-axis at y=0.

Still referring to FIG. 2, the analog output signal 42 generated by the second version of the DAC 22 is also linear for the reasons described above.

But the second version of the DAC 22 has a non-zero output offset because the analog output signal 42 equals a non-zero value for an input value of 0. Because the analog output signal 42 equals 40 mV for an input value of 0, the output offset of the second version of the DAC 22 is 40 mV. Or, stated differently, the second version of the DAC 22 has a 40 mV output offset because the plot of the analog output signal 42 intercepts the y-axis at y=40 mV.

Referring to FIGS. 1 and 2, it can be shown mathematically that as long as the DAC 22 of the ADC 10 generates the signal FEEDBACK having a constant gain and offset, the DAC will not introduce any non-linear distortion into the signals FEEDBACK or DIGITAL_OUT even if the DAC output offset does not equal zero. And when the gain and offset of the DAC 22 are constant, the loop filter 16, or the filter and decimator 20, can compensate for the affect that the gain or offset may have on the output digital signal DIGITAL_OUT by effectively applying to DIGITAL_OUT a compensating gain or offset. For example, if the DAC 22 offset is 40 mV, then the filter 16 or the filter and decimator 20 effectively can add −40 mV to DIGITAL_OUT to cancel the offset. Or, if, for example, the gain of the feedback DAC 22 is five, then the filter 16 or the filter and decimator 20 effectively can attenuate DIGITAL_OUT by ⅕ cancel out the gain of the feedback DAC.

Figure 3:
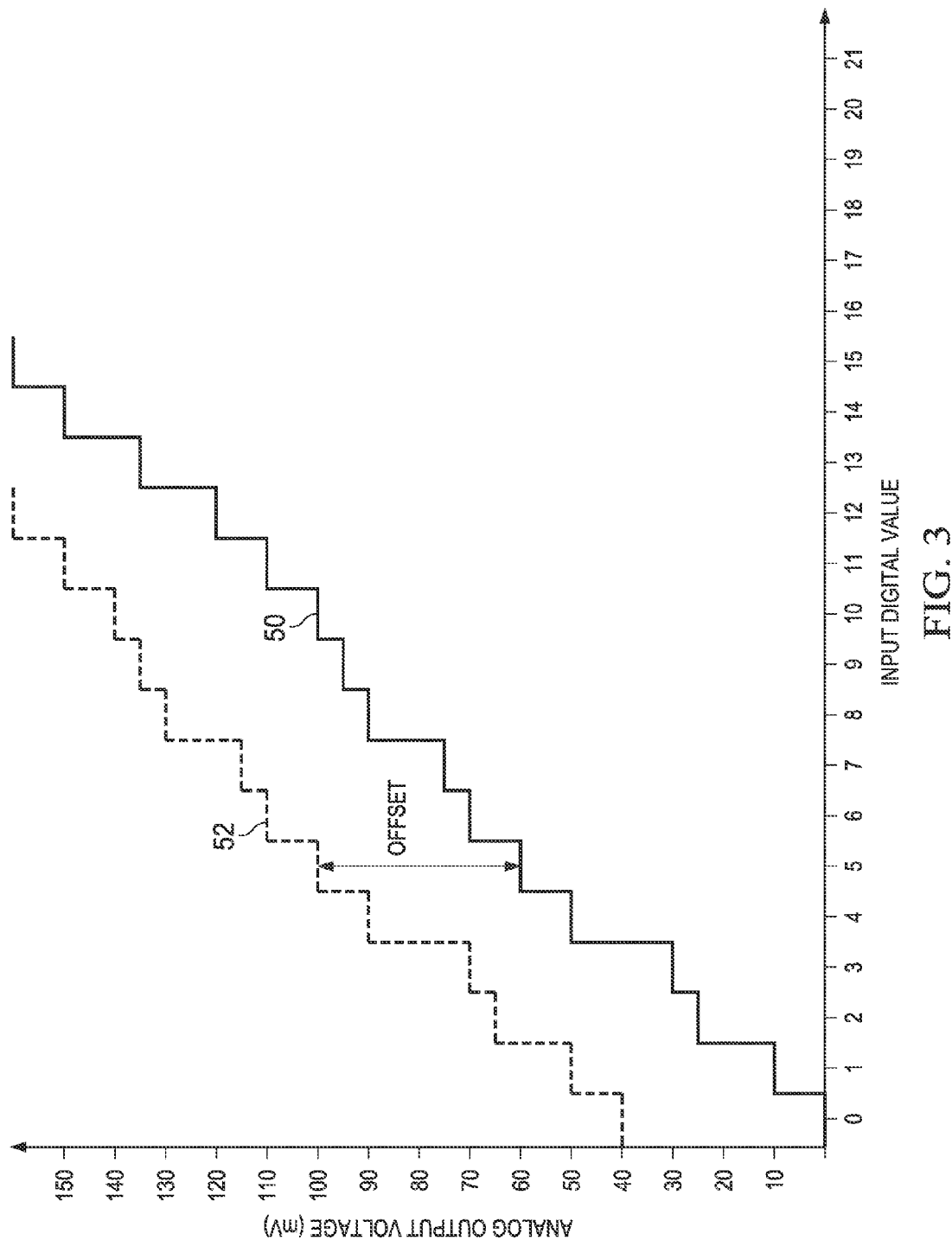
FIG. 3 is plot of the digital input versus the analog output of a non-linear DAC for two levels of output offset.

FIG. 3 is a plot of analog output signals 50 and 52 generated by respective non-linear versions of the DAC 22 of FIG. 1 in response to a linearly ramping digital input signal. The signal 50 is generated by a non-linear, multi-bit first version of the DAC 22 having zero output offset, and the signal 52 is generated by a non-linear, multi-bit second version of the DAC having a non-zero output offset.

The analog output signal 50 is non-linear because the gain of the first non-linear version of the DAC 22 varies depending on the value of the digital input signal. For example, for an input value of 8, the analog output signal 50 has a value of 90 mV, for a gain of 90/8=11.25 mV/LSB. But for an input value of 12, the analog output signal 50 has a value of 120 mV, for a gain of 120/12=10 mV/LSB. Another way to view this non-linear gain is to look at the change in the output signal 50 for each LSB increment of the digital input signal. For example, for an LSB increment of the input signal from 3 to 4, the output signal 50 increases by 20 mV, which is equivalent to a gain of 20 mV/LSB. But for an LSB increment of the input signal from 9 to 10, the output signal 50 increases by only 5 mV, which is equivalent to a gain of 5 mV/LSB, which is only 25% of the gain for the LSB increment from 3 to 4. Also, another indication of the non-linearity of the DAC 22 is that no straight line can be drawn through the same relative point of each step of the output signal 50.

Furthermore, the first version of the nonlinear DAC 22 has a zero output offset because the analog output signal 50 equals zero for an input value of 0.

The analog output signal 52 generated by the second non-linear version of the DAC 22 is also non-linear for the reasons described above.

But the second non-linear version of the DAC 22 has a non-zero output offset because the analog output signal 52 equals a non-zero value for an input value of 0. Because the analog output signal 52 equals 40 mV for an input value of 0, the output offset of the second non-linear version of the DAC 22 is 40 mV.

Referring to FIGS. 1 and 3, it can be shown mathematically that if the DAC 22 of the ADC 10 generates the signal FEEDBACK having a non-constant gain, i.e., in a non-linear manner, then the DAC will introduce non-linear distortion into the signals FEEDBACK and DIGITAL_OUT regardless of whether the DAC output offset equals 0.

Although this non-linear distortion can be characterized and treated as noise, at least some of noise caused by non-linear distortion may be at frequencies so close to the sample frequency of DIGITAL_OUT that it is impractical to impossible for the loop filter 16 or the filter and decimator 20 (FIG. 1) to block all of this noise without also blocking frequencies of interest, i.e., frequencies that compose the useful spectrum of DIGITAL_OUT. Another way to view the resultant noise of non-linear distortion caused by a non-linear feedback DAC 22 is that it may cause the frequency band that the quantization noise occupies to be close to, or actually to overlap, the frequency band of the of-interest components of DIGITAL_OUT.

Referring to FIGS. 1-3, one may reduce or eliminate the non-linear distortion introduced into DIGITAL_OUT by a multi-bit version of the feedback DAC 22 by shaping the non-linear-distortion noise such that it can be filtered out of DIGITAL_OUT, or such that it is transformed in a manner that does not distort DIGITAL_OUT.

As described below, if the feedback DAC 22 is a non-linear multi-bit thermometer-coded DAC, then a technique for reducing or eliminating the non-linear distortion that the DAC introduces into DIGITAL_OUT is dynamic element matching (DEM) such as data-weighted averaging (DWA).

Figure 4:
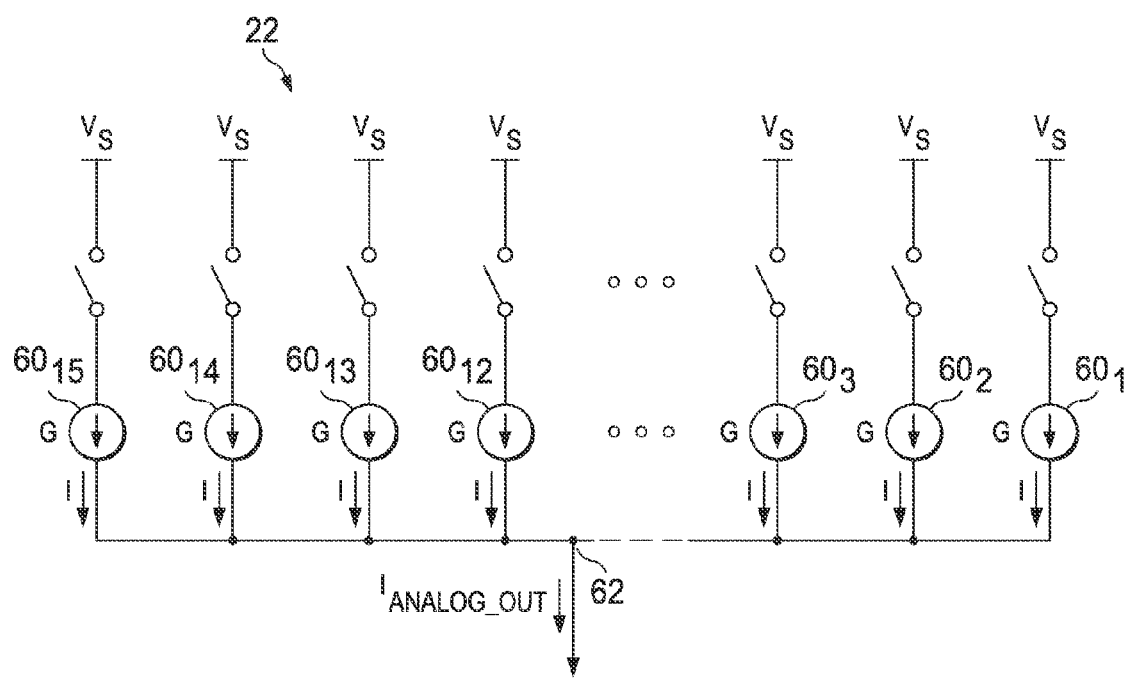
FIG. 4 is diagram of an unsegmented DAC.

FIG. 4 is a diagram of a non-linear multi-bit version of the DAC 22 of FIG. 1.

This version of the DAC 22 includes $2^N-1$ current-source elements $60_1$-$60_2{}^N{}_{-1}$, where N is the number of bits of the digital signal input to the DAC. In the example shown in FIG. 4 and described below, the DAC 22 is a 4-bit thermometer-coded DAC (N=4) having 15 current-source elements $60_1$-$60_{15}$. Consequently, the number of current-source elements 60 is one less than the total number $2^N$ of possible values that the digital input signal can assume (this is because for an input value of zero, no current-source elements need to be activated). In this example, because the total number of possible values that the N=4-bit digital input signal can assume is $2^4=16$, the number of current-source elements 60 is equal to 16−1=15.

Ideally, each current-source element 60 has a same gain G, and, therefore, generates a same current I, as the other current-source elements when activated. The currents I from all of the current-source elements 60 are summed at a node 62, and the resulting current $I_{analog\text{-}output}$ is the output of the DAC 22; if the DAC 22 outputs a voltage, then the current $I_{analog\text{-}output}$ may be coupled to a temperature-compensated impedance (not shown in FIG. 4) to generate an output voltage $V_{analog\text{-}output}$ (not shown in FIG. 4).

Table I shows one possible, intuitive correspondence between the values of the 4-bit digital input signal and the ones of the current-source elements 60 activated to generate $I_{analog\text{-}out}$.

TABLE I

| 4-bit value of digital input signal | Active current-source elements 60 |
| --- | --- |
| 0000 | None |
| 0001 | $60_1$ |
| 0010 | $60_1$-$60_2$ |
| 0011 | $60_1$-$60_3$ |
| 0100 | $60_1$-$60_4$ |
| 0101 | $60_1$-$60_5$ |
| 0110 | $60_1$-$60_6$ |
| 0111 | $60_1$-$60_7$ |
| 1000 | $60_1$-$60_8$ |
| 1001 | $60_1$-$60_9$ |
| 1010 | $60_1$-$60_{10}$ |
| 1011 | $60_1$-$60_{11}$ |
| 1100 | $60_1$-$60_{12}$ |
| 1101 | $60_1$-$60_{13}$ |
| 1110 | $60_1$-$60_{14}$ |
| 1111 | $60_1$-$60_{15}$ |

Referring to FIGS. 1-2 and 4, if the 4-bit thermometer-coded DAC 22 of FIG. 4 is ideal, i.e., the gain G, and thus the current I, are the same for all current-source elements 60, then the DAC 22 is linear, and for a linearly ramped digital input signal, $I_{analog\text{-}output}$ is linear like the signals 40 and 42. Such an ideal DAC 22 may be said to have matching current-source elements, or, more succinctly, matching elements.

Unfortunately, a thermometer-encoded DAC is rarely, if ever, ideal. That is, the gain G of, and the current generated by, one current-source element is typically different, even if only slightly, from the gain of, and the current generated by, at least one of the other current-source elements.

For example, referring to FIGS. 1 and 3-4, if the 4-bit thermometer-coded DAC 22 of FIG. 4 is non-ideal, i.e., the current-source element $60_1$ has a gain $G_1$ and generates a current $I_1$, the current-source element $60_2$ has a gain $G_2$ and generates a current $I_2$, the current-source element $60_3$ has a gain $G_3$ and generates a current $I_3$, and so on, then the DAC 22 is non-linear, and for a linearly ramped digital input signal, $I_{analog\_output}$ is non-linear like the signals 50 and 52. Such a non-ideal DAC 22 may be said to have mismatched current-source elements, or, more succinctly, mismatched elements.

Referring to FIG. 4 and Table I, one can see, for example, that the current-source element $60_1$ is active for all values of the digital input signal other than 0, that the current-source element $60_2$ is active for all values of the digital input signal other than 0 and 1, and that the current-source element $60_{15}$ is active for only a 1111 binary value for the digital input signal.

Therefore, the component of the non-linearity introduced, for example, by the element $60_1$ has a much higher frequency than the component of the non-linearity introduced, for example, by the element $60_{15}$; consequently, although the components of the non-linearity introduced by the lower-numbered elements 60 (e.g., $60_1$, $60_2$, and $60_3$) may be filtered out, the components of the non-linearity introduced by the higher-numbered elements 60 (e.g., $60_{13}$, $60_{14}$, and $60_{15}$) may be impractical or impossible to filter out due to their lower frequencies.

Still referring to FIGS. 1 and 4 and to Table I, data-weighted averaging (DWA), which is a subset of dynamic element matching (DEM), is a technique for effectively reducing or eliminating the non-linear distortion that a non-linear thermometer-coded DAC 22 introduces into its output signal FEEDBACK, and into the ADC 10 output signal DIGITAL_OUT.

In general, the DAC 22 implements DWA by activating, on average, each element 60 of the DAC 22 the same number of times as each of the other elements 60. That is, the DAC 22 effectively keeps track of how many times each of the elements 60 has been activated, and strives to maintain this number the same, or close to the same, for all elements 60. For example, the DAC 22 may keep a relative +/− count for each element 60. In a detailed example, the count for the element 60 currently having the highest number of activations may be 0, and the counts for the other elements 60 may be −1 and lower. The DAC 22 activates the elements 60 in a sequence that maintains the counts for all of the elements 60 at or near 0. For example, if the input digital signal has a sequence of values 0001, 0001, 0001, then, instead of activating the element $60_1$ (and deactivating the elements $60_2$-$60_{15}$) for three consecutive sample times per Table 1, the DAC 22 may sequentially activate (and deactivate) the following elements: activate $60_1$ (deactivate $60_2$-$60_{15}$), activate $60_2$ (deactivate $60_1$ and $60_3$-$60_{15}$), and activate $60_3$ (deactivate $60_1$-$60_2$ and $60_4$-$60_{15}$).

It can be shown mathematically that DWA significantly reduces the level of non-linearity that the non-linear multi-bit thermometer-coded DAC 22 introduces into FEEDBACK and DIGITAL_OUT, or altogether eliminates this non-linearity from FEEDBACK and DIGITAL_OUT.

Referring again to FIG. 1, DWA does this by shifting the frequency components of the non-linearity of the DAC 22 far enough above the frequency band of interest for DIGITAL_OUT such that the loop filter 16, or the filter and decimator 20, can filter out the non-linearity frequency components.

Specifically, the loop filter 16 or the filter and decimator 20 effectively averages the non-linearity introduced by the DAC 22 such that the non-linearity appears to introduce a constant error to the normalized gain α of the ADC 10 according to the following equation:

$$\alpha = 1 + \frac{e_1 + \ldots + e_{2^N - 1}}{2^N - 1} \quad (1)$$

where $$\frac{e_1 + \ldots + e_{2^N - 1}}{2^N - 1}$$

is the error term, and $e_x$, which can be positive or negative, is the difference between the ideal gain G and the actual gain $G_x$ of an element $60_x$.

But as described above, because the resulting gain kα (k is a scalar that, when multiplied by the normalized gain α, yields the actual gain) of the DAC 22 is constant, the DAC 22 adds little or no non-linearity to its output signal FEEDBACK or to the ADC 10 output signal DIGITAL_OUT.

Consequently, referring to FIGS. 1-4, if one includes in the ADC 10 a non-linear thermometer-coded multi-bit DAC 22 that implements DWA, then he/she can realize the benefits (e.g., lower quantization-noise power, greater loop-stability margin) of a multi-bit quantizer 18 without introducing significant non-linear distortion into the DAC output signal FEEDBACK or into the ADC output signal DIGITAL_OUT. For example, it can be shown mathematically that if the maximum mismatch of the elements 60 is ±5% (i.e., the difference between $G_x$ for an element $60_x$ and the ideal gain G is no greater than the ±5%), then the ADC 10 can generate DIGITAL_OUT with an SNR of at least 120 dB if the DAC 22 is a non-linear, thermometer-coded, DWA DAC.

Referring to FIG. 4, alternate embodiments of the 4-bit DAC 22 are contemplated. For example, the DAC current-source elements 60 may be replaced with capacitive or other types of DAC elements.

Still referring to FIG. 4, a potential problem with even a DWA version of the DAC 22 is that the number of DAC elements 60, and thus the number of lines that carry the currents generated by the elements 60, increase exponentially with the resolution of the quantizer 18. For example, the DWA version of the 4-bit DAC 22 of FIG. 4 has 15 lines and 15 DAC elements 60, and a 5-bit DWA DAC would have 31 lines and 31 DAC elements. But a 6-bit DWA DAC would have 63 lines and 63 DAC elements 60, an 8-bit DWA DAC would have 255 lines and 255 DAC elements, and a 16-bit DWA DAC would have 65,535 lines and 65,535 DAC elements!

Figure 5:
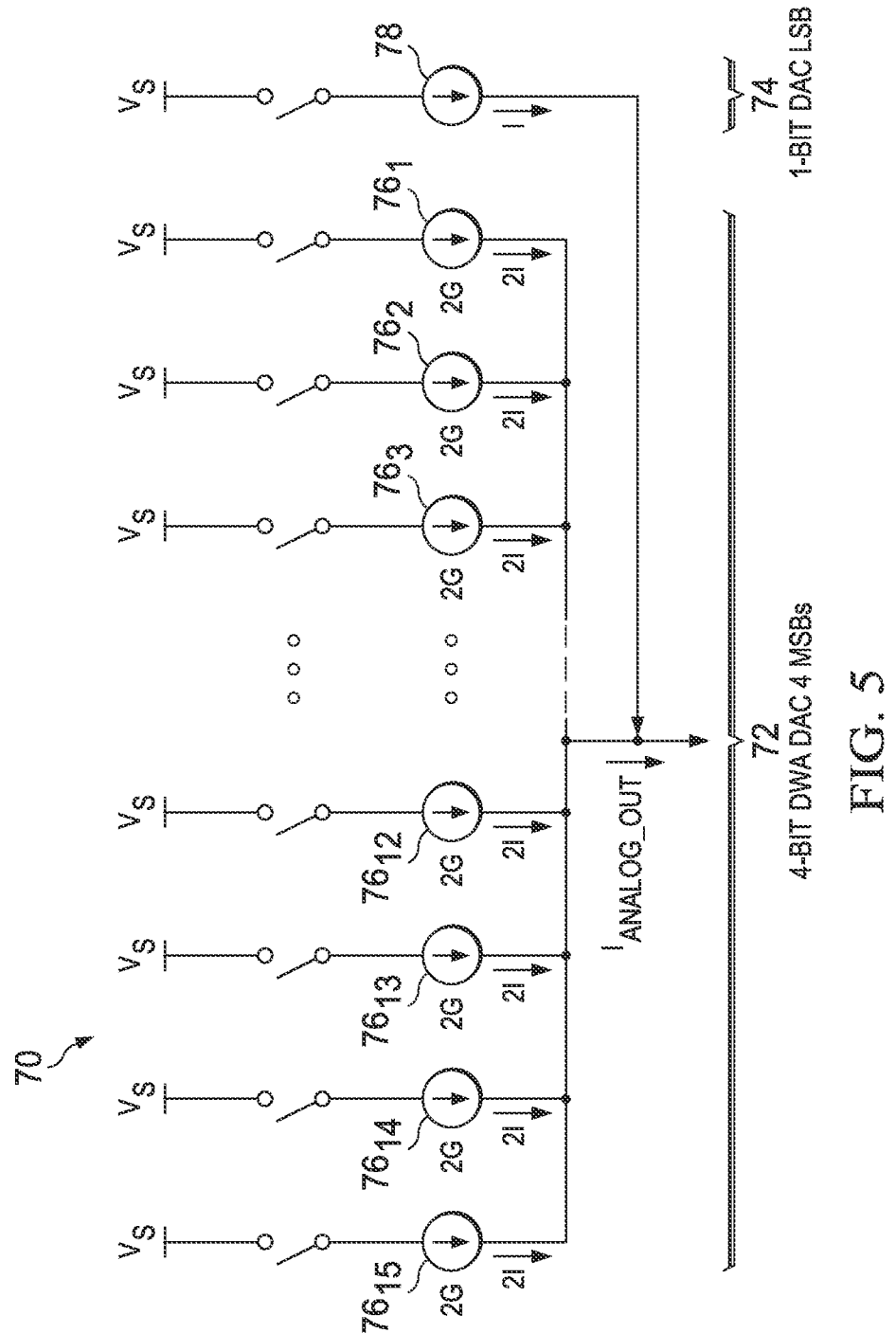
FIG. 5 is a diagram of a segmented DAC.

FIG. 5 is a diagram of a segmented 5-bit DAC 70, according to an embodiment. As described below, segmenting a DAC allows one to increase the resolution of the quantizer 18 of the ADC 10 of FIG. 1 without exponentially increasing the number of DAC elements and element lines.

Referring to FIG. 5, the 5-bit DAC 70 has a first, 4-bit segment 72, and has a second, 1-bit segment 74.

The first segment 72, which may be similar to the DWA version of the DAC 22 of FIG. 4, provides the components of $I_{analog\_output}$ corresponding to the four most-significant bits (MSBs) of the digital input signal, includes fifteen DAC current-source elements $76_1$-$76_{15}$ each having a gain of approximately 2G, and implements DWA as described above in conjunction with FIG. 4.

The second segment 74 provides the component of $I_{analog\_out}$ corresponding to the least-significant bit (LSB) of the digital input signal, and includes a single DAC current element $78_1$ having a gain of approximately G, which is ½ of the ideal gain 2G of each of the current elements 76 of the first segment 72. The reason for this gain scaling between the first and second segments 72 and 74 is that the component of $I_{analog\_out}$ provided by the element $78_1$ corresponds to the $2^0$ bit position of the digital input signal, and the components of $I_{analog-out}$ respectively provided by the elements 76 each correspond to the $2^1$ bit position of the digital input signal.

Figure 6:
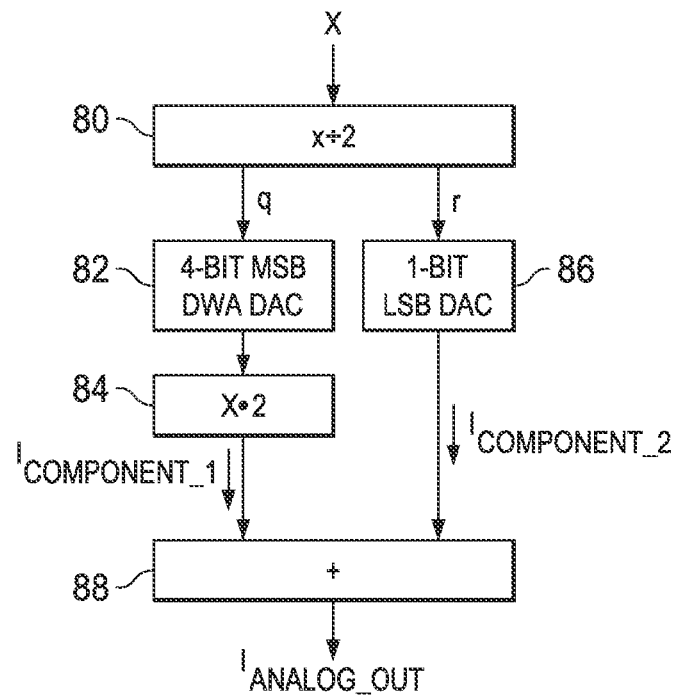
FIG. 6 is a diagram of the operation of the segmented DAC of FIG. 5.

FIG. 6 is a flow diagram of the operation of the segmented DAC 70 of FIG. 5.

Referring to FIGS. 5-6, operation of the DAC 70 is described.

At a step 80, a controller or other circuit (not shown in FIG. 5) divides the digital input value x by 2 (x/2 or x modulo 2) to generate a 4-bit quotient q and a 1-bit remainder r.

At steps 82 and 84, the DWA first segment 72 generates a first component $I_{component\_1}$ of $I_{analog\_output}$ in response to q and independently of r.

At step 82, the first segment 72 first determines how many of the current elements 76 are to be activated in response to q. For example, if q=0101, then the first segment 72 determines that five of the current elements 76 are to be activated, and if q=1000, then the first segment determines that eight of the current elements 76 are to be activated. Next, the first segment 72 uses DWA to determine which of the current elements 76 to activate, and activates these current elements.

At step 84, the DWA first segment 72 multiplies by two the current resulting from the activated current elements 76. In actuality, because the ideal gains of the current elements 76 are twice the ideal gain of the element 78, the current elements 76 inherently perform this multiplication by two.

And, at step 86, the second segment 74 generates a second component $I_{component\_2}$ of $I_{analog-output}$ in response to r and independently of q. For example, if r=0, then the second segment 74 does not activate the current element 78, and if r=1, then the second segment activates the current element 78; that is, for even values of x, r=0 and the element 78 is inactive, and for odd values of x, r=1 and the element 78 is active.

And, at a step 88, the components $I_{component\_1}$ and $I_{component\_2}$ from the first and second segments 72 and 74 are summed to generate $I_{analog\_out}$.

Still referring to FIGS. 5 and 6, alternate embodiments of the DAC 70 are contemplated. For example, the DAC 70 may have more than two segments, and the current-source elements 76 may be replaced with capacitor or other types of DAC elements. Furthermore, the steps described in conjunction with FIG. 6 may be performed in any other sequence or during overlapping time periods, and some steps may be omitted and other steps may be added, depending on the application in which the DAC 70 is used.

Referring to FIGS. 1 and 5-6, a potential problem with the DAC 70 is that if it is used in the ADC 10 as the feedback DAC 22, then, the SNRs of FEEDBACK DIGITAL_OUT are significantly degraded even though the first DAC segment 72 operates according to a DWA algorithm. For example, even with a maximum mismatch between the current-source elements 76 and 78 of ±1%, the SNR of DIGITAL_OUT is less than 90 dB, which may be too low for some applications.

One reason for the degraded SNRs is that due to mismatches between the current-source element 78 and the current-source elements 76, the gains of the first and second DAC segments 72 and 74 will typically be different, and this gain difference will not be constant, but will depend on the value of the input digital signal x; it is this gain difference that gives rise to a SNR-reducing non-linearity of the signals FEEDBACK and DIGITAL_OUT of the ADC 10 (FIG. 1).

And, unfortunately, DWA is not a solution to this potential problem. Because the current-source element 78 of the DAC 70 has a different gain, i.e., weight, than the current-source elements 76, one cannot extend the DWA operation of the first segment 72 to the second segment 74; that is, the DAC 70 cannot swap the element 78 with any of the elements 76 without causing significant error in $I_{analog\_out}$ (FEEDBACK) and in DIGITAL_OUT.

Figure 7:
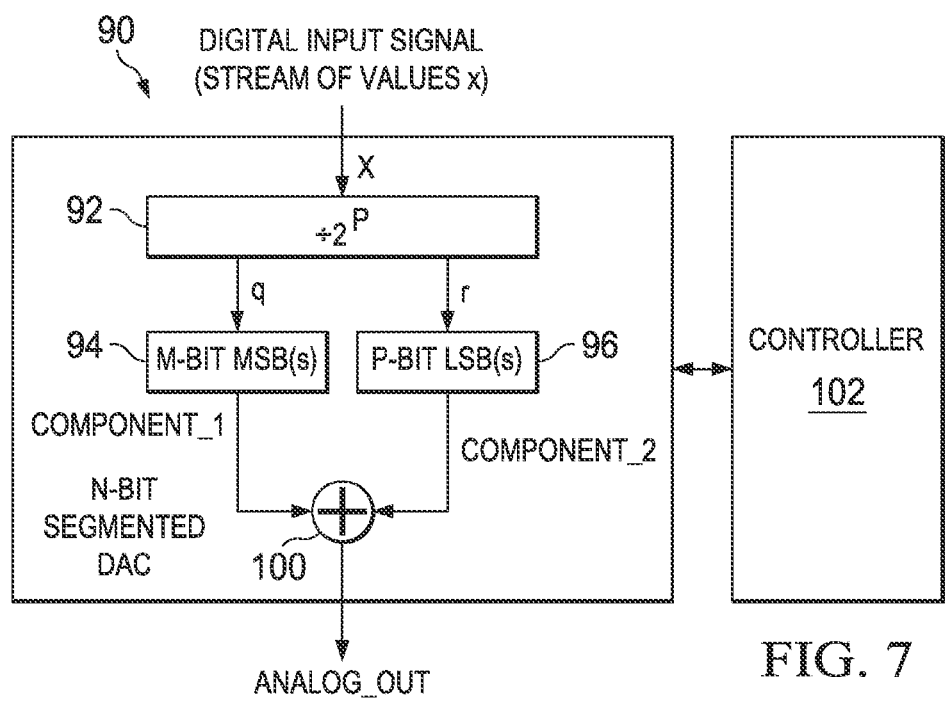
FIG. 7 is a diagram of a segmented DAC, according to an embodiment.

FIG. 7 is a diagram of an N-bit segmented DAC 90, which, when used in the ADC 10 of FIG. 1, can allow the feedback signal FEEDBACK and the ADC output signal DIGITAL_OUT to have a higher SNRs as compared to the segmented DAC 70 of FIG. 5. For example, with a maximum, random mismatch of ±1% for the DAC elements in the different segments of the DAC 90, the SNR of DIGITAL_OUT may be 100 dB or greater, such as 120 dB or greater.

The N-bit segmented DAC 90 includes an input-value divider 92, an m-bit first segment 94, a p-bit second segment 96, a combiner 100, and a controller 102. The DAC 90 outputs an analog signal ANALOG_OUT, which may be a current $I_{analog\_out}$ or a voltage $V_{analog\_out}$.

During operation of the DAC 90, the controller 102 causes the divider 92, first segment 94, second segment 96, and combiner 100 to operate as follows.

First, the divider 92 divides the digital input value x by $2^p$ ($x/2^p$ or x modulo $2^p$) to generate an m-bit quotient q and a p-bit remainder r. In an example, N=5, m=4, p=1, and $2P=2^1=2$.

Next, the m-bit first segment 94 generates a first component COMPONENT_1 of the DAC output signal ANALOG_OUT in response to q and r. First, the controller 102 determines, in response to q and the value and cycle position of r, if any of the DAC elements of the second segment 96 are to be swapped for any of the DAC elements of the first segment 94. For example, if p=1, r has two possible values, 0 and 1. If two occurrences of r=0 form a sequence, or cycle, of 0s, then the first occurrence of r=0 in a cycle of 0s is in a first cycle position, and the second occurrence of r=0 in a cycle of 0s is in a second cycle position. If the controller 102 determines that at least one of the DAC elements of the second segment 96 is to be swapped for at least one of the DAC elements of the first segment 94, then the controller 102 generates a corresponding value y≠0; if not, the controller generates y=0. Then, the controller 102 determines a number of DAC elements of the first segment to be activated in response to q-y. For example, if m=4 and q-y=0101, then the first segment 94 determines that five of its DAC elements are to be activated, and if q-y=1000, then the controller 102 determines that eight of its DAC elements are to be activated. Next, the controller 102 operates according to a DWA algorithm to select which of its DAC elements to activate; that is, continuing the above example, if q-y=0101, then the controller uses DWA to select the five DAC elements of the first segment 94 to activate, and if q-y=1000, then the controller uses DWA to select the eight DAC elements of the first DAC segment to activate. Then, the controller 102 activates the selected DAC elements of the first DAC segment 94. The operation of the first DAC segment 94 is described in more detail below in conjunction with FIGS. 8-11.

Then, the second DAC segment 96 of the DAC 90 generates a second component COMPONENT_2 of ANALOG_OUT in response to the current value of r, the cycle position associated with the current value of r, and possibly q (for example, the second DAC segment may be responsive to q when x=q=r=0 so that no DAC elements of the first and second DAC segments are activated when the input digital signal is zero). The operation of the second DAC segment 96 may overlap in time the above-described operation of the first DAC segment 94.

Next the combiner 100 adds together the components COMPONENT_1 and COMPONENT_2 from the first and second DAC segments 94 and 96 to generate the analog output signal ANALOG_OUT of the DAC 90.

Still referring to FIG. 7, alternate embodiments of the segmented DAC 90 are contemplated. For example, the DAC 90 may include more than two segments 94 and 96. Furthermore, the combiner 100 may perform a combining operation other than adding.

Figure 8:
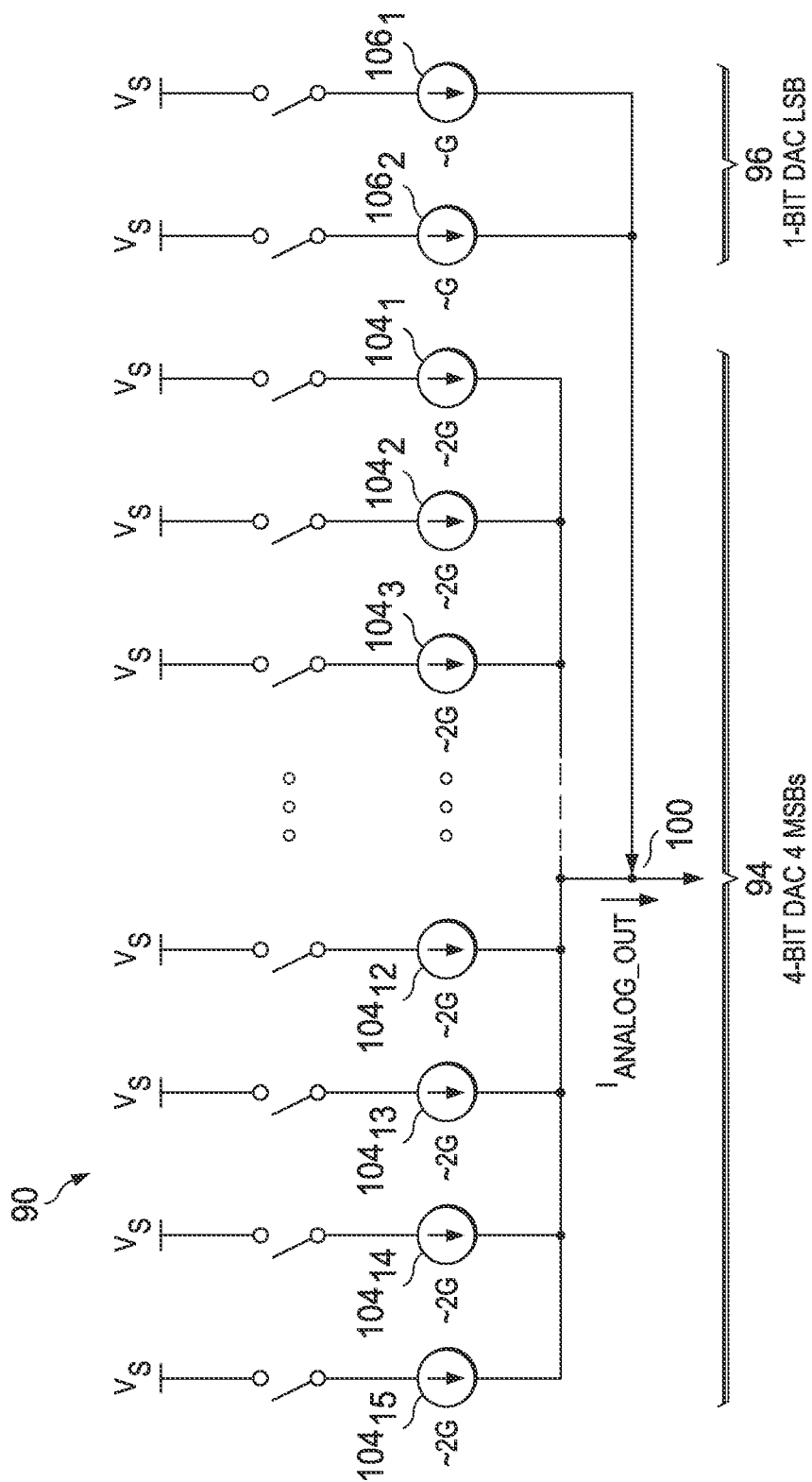
FIG. 8 is a diagram of the segments of a 5-bit version of the segmented DAC of FIG. 7, according to an embodiment.

FIG. 8 is a diagram of the first and second segments 94 and 96 and the combiner 100 of a 5-bit current-output version of the DAC 90 of FIG. 7, according to an embodiment where N=5, m=4, and p=1.

The 4-bit first segment 94, which may be similar to the 4-bit segment 72 of the DAC 70 of FIG. 5, is configured to generate a first component of $I_{analog\_out}$ corresponding to the four most-significant bits (MSBs) of the digital input signal x, and includes fifteen DAC current-source elements $104_1$-$104_{15}$ each having a gain of approximately 2G, which is the ideal gain for each of the current-source elements 104. Specifically, each element $104_x$ has a gain of $2G+e_x$, where $e_x$ is the gain error having a positive or negative value. For example, $e_x$ may be approximately in the range of 0%-5% of 2G.

The second segment 96 is configured to generate a second component of $I_{analog\_out}$ corresponding to the least-significant bit (LSB) of the digital input signal x, and includes two DAC current-source elements $106_1$-$106_2$ each having a gain of approximately G, which is the ideal gain for each of the current-source elements 104, and which is ½ of the ideal gain 2G of each of the current elements 104 of the first segment 94. Specifically, each current element $106_x$ has a gain of $G+e_x$, where $e_x$ is the gain error having a positive or negative value. For example, $e_x$ may be in the range of 0%-5% of G. The reason for this gain scaling of two between the first and second segments 94 and 96 is that the component of $I_{analog\_out}$ generated by the elements $106_1$-$106_2$ corresponds to the $2^0$ bit position of digital input signal x, and the component of $I_{analog\_out}$ generated by the elements 104 corresponds to the $2^1$ bit position of x.

And the combiner 100 is a current-summing node to which the outputs of all of the current elements 104 and 106 are coupled.

Even though the 5-bit segmented DAC 90 of FIG. 8 includes one additional current element $106_2$ (for a total of 17 elements 104 and 106 and 17 lines respectively coupled to these elements) as compared to the 5-bit segmented DAC 70 of FIG. 5, this is still significantly fewer DAC elements and lines than a 5-bit DWA DAC, which includes 31 DAC elements and 31 lines.

In general, as described in more detail below, an embodiment of the 5-bit version of the DAC 90 generates $I_{analog\_out}$ with less non-linear distortion than the segmented DAC 70 of FIG. 5 by sometimes swapping both of the current elements 106 of the second segment 96 for one of the current elements 104 of the first segment 94. The controller 102 (FIG. 7) operates the 4-bit first DAC segment 94 in a DWA fashion, except that sometimes, instead of activating all of the current elements 104 needed to generate the first component of $I_{analog\_out}$, the controller deactivates, or maintains inactive, one of these current elements 104, and, in its place, activates both of the current elements 106.

Still referring to FIG. 8, Table I describes the activation of the DAC elements 106 of the second DAC segment 96 versus the current value and cycle position of the remainder r, according to an embodiment.

TABLE I

| q | r | r cycle position | DAC element $106_2$ | DAC element $106_1$ |
|---|---|---|---|---|
| 0 | 0 | Don't care | Inactive | Inactive |
| ≠0 | 0 | 1$^{st}$ position | Inactive | Inactive |
| ≠0 | 0 | 2$^{nd}$ position | Active and swapped | Active and swapped |
| Don't care | 1 | 1$^{st}$ position | Inactive | Active and not swapped |
| Don't care | 1 | 2$^{nd}$ position | Active and not swapped | Inactive |

One can make the following observations from Table I. When q=0 and r=0, which means that x=0, then the DAC elements 104 and 106 are all inactive, and, therefore, no swapping occurs. When q≠0 and r=0, in the first cycle position the DAC elements $106_1$ and $106_2$ are both inactive, and, therefore, no swapping occurs; but in the second sequence position, the DAC elements $106_1$ and $106_2$ are both active, and the controller 102 (FIG. 7) deactivates, or maintains inactive, one of the DAC elements 104 such that the active elements $106_1$ and $106_2$ are effectively swapped for the inactive DAC element 104 that would otherwise be active. The controller 102 activates two current elements 106 as a replacement for one current element 104 because the gains of the current elements 106 are each approximately ½ of the gains of the current elements 104. And when r=1, regardless of the value of q, in the first cycle position element $106_1$ is active and element $106_2$ is inactive because only one of the elements 106 need be active in response to the LSB of x equaling 1, and in the second cycle position the element $106_1$ is inactive and the element $106_2$ is active.

Still referring to Table I, in summary, by alternately swapping the elements 106 for an element 104 in response to r=0 (and q≠0), and by alternately activating the elements $106_1$ and $106_2$ in response to r=1, the controller 102 operates the first and second DAC segments 94 and 96 in a manner that shapes the non-linearity noise caused by the gain difference between the first and second DAC segments. Specifically, the controller 102 effectively pushes this non-linearity noise to higher frequencies so that more of this noise can be removed by the filter 16, or by the filter and decimator 20, of FIG. 1 as compared to the segmented DAC 70 of FIG. 5.

Figure 9:
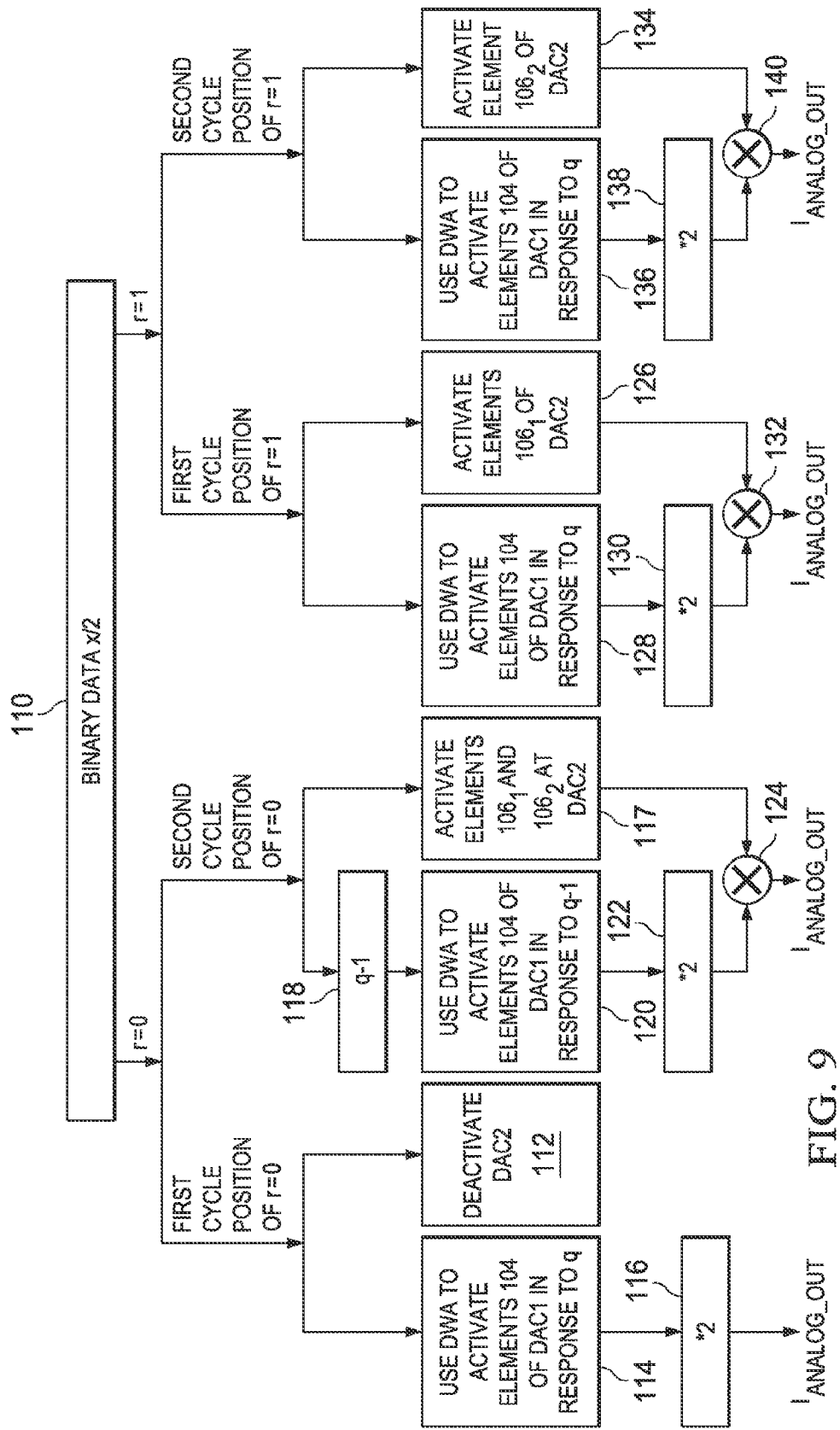
FIG. 9 is a diagram of the operation of the 5-bit version of the segmented DAC of FIGS. 7-8, according to an embodiment.

FIG. 9 is a flow diagram of the operation of the 5-bit version of the segmented DAC 90 of FIGS. 7 and 8, according to an embodiment.

Referring to FIGS. 7-9, the operation of the DAC 90 is described, according to an embodiment.

At step 110, the controller 102 divides the digital input value x by $2^P=2^1=2$ to generate a 4-bit quotient q and a 1-bit remainder r.

During a first cycle position for r=0, at step 112 the controller 102 deactivates the second DAC segment 96 (DAC2 in FIG. 9).

At step 114, the controller 102 determines how many of the current-source elements 104 of the first DAC segment 94 (DAC1 in FIG. 9) are to be activated in response to q (the value y described above in conjunction with FIG. 7 is 0), determines which of the elements to activate using DWA, and then activates these elements. For example, if q=0101, then the controller 102 determines that five of the current elements 104 are to be activated, uses DWA to determine which five of the current elements 104 to activate, and activates these five current elements 104.

Then, at step 116, the first DAC segment 94 effectively multiplies by approximately two the signal generated by the active elements 104 to generate $I_{analog\_output}$ (because the second DAC segment 96 is inactive, the first DAC segment generates $I_{analog\_out}$ in its entirety). As described above, this multiply by two is because the elements 104 each correspond to a bit in the $2^1=2$ bit position of x, and is inherently effected by the gain of each of the DAC elements 104 of the first DAC segment 94 being approximately twice the gain of each of the DAC elements 106 of the second DAC segment 96.

During a second cycle position for r=0, at step 117 the controller 102 activates the elements $106_1$ and $106_2$ of the second DAC segment 96 (DAC2 in FIG. 9) to generate a second component of $I_{analog\text{-}out}$—as described above, however, the controller 102 deactivates the elements $106_1$ and $106_2$ if q=x=r=0.

At step 118, the controller 102 subtracts y=1 one from q because the active elements $106_1$ and $106_2$ take the place of one of the current elements 104 that the controller would otherwise activate in response to q.

Then, at step 120, the controller 102 determines how many of the current elements 104 of the first DAC segment 94 (DAC1 in FIG. 9) are to be activated in response to q−1, determines which of the elements to activate using DWA, and then activates these elements. For example, if q=0101, then q−0001=0100 and the controller 102 determines that four of the current elements 104 are to be activated. Next, the controller 102 uses DWA to determine which of the four current elements 106 to activate, and activates these four current elements.

Next, at step 122, the first DAC segment 94 effectively multiplies by approximately two the signal generated by the active elements 104 to generate a first component of $I_{analog\_output}$. As described above, this multiply by two is because the elements 104 each correspond to a bit in the $2^1=2$ bit position, and is inherently effected by the gain of each of the DAC elements 104 of the first DAC segment 94 being approximately twice the gain of each of the DAC elements 106 of the second DAC segment 96.

Then, at step 124, the first and second components of $I_{analog\_out}$ are summed at the summing node 100 to generate $I_{analog\_out}$.

The controller 102 keeps track of the cycle positions for r, and repeats the above-described sequential, cyclic, procedure for subsequent occurrences of r=0.

Still referring to FIG. 9, during a first cycle position for r=1, at step 126 the controller 102 activates the element $106_1$ and deactivates the element $106_2$ of the second DAC segment 96 (DAC2 in FIG. 9) to generate a second component of $I_{analog-out}$.

At step 128, the controller 102 determines how many of the current elements 104 of the first DAC segment 94 (DAC1 in FIG. 9) are to be activated in response to q (y=0 because this is the first cycle position of r=1), determines which of the elements to activate using DWA, and then activates these elements. For example, if q=0101, then the controller 102 determines that five of the current elements 104 are to be activated. Next, the controller 102 uses DWA to determine which five of the current elements 104 to activate, and activates these five current elements.

Then, at step 130, the first DAC segment 94 effectively multiplies by approximately two the signal generated by the active elements 104 to generate a first component of $I_{analog\_output}$. As described above, this multiply by two is because the elements 104 each correspond to a bit in the $2^1=2$ bit position, and is inherently effected by the gain of each of the DAC elements 104 of the first DAC segment 94 being approximately twice the gain of each of the DAC elements 106 of the second DAC segment 96.

Next, at step 132, the first and second components of $I_{analog\_out}$ are summed at the summing node 100 to generate $I_{analog\_out}$.

And during a second cycle position for r=1, at step 134 the controller 102 deactivates the element $106_1$ and activates the element $106_2$ of the second DAC segment 96 (DAC2 in FIG. 9) to generate a second component of $I_{analog-out}$.

At step 136, the controller 102 determines how many of the current elements 104 of the first DAC segment 94 (DAC1 in FIG. 9) are to be activated in response to q (y=0 because this is the first cycle position of r=1), determines which of the elements to activate using DWA, and then activates these elements. For example, if q=0101, then the controller 102 determines that five of the current elements 104 are to be activated. Next, the controller 102 uses DWA to determine which five of the elements 104 to activate, and activates these five elements.

Then, at step 138, the first DAC segment 94 effectively multiplies by approximately two the signal generated by the active elements 104 to generate a first component of $I_{analog\_output}$. As described above, this multiply by two is because the elements 104 each correspond to a bit in the $2^1=2$ bit position, and is inherently effected by the gains of each of the DAC elements 104 of the first DAC segment 94 being approximately twice the gain of each of the DAC elements 106 of the second DAC segment 96.

Next, at step 140, the first and second components of $I_{analog\_out}$ are summed at the summing node 100 to generate $I_{analog\_out}$.

The controller 102 keeps track of the cycle positions for r, and repeats the above-described sequential, cyclic procedure for subsequent occurrences of r=1.

Still referring to FIGS. 7-9, as described above, the first DAC segment 94 uses DWA to average/remove the non-linearity caused by its mismatch error by converting the mismatch error to a constant gain error, at least ideally.

For the second DAC segment 96, the average mismatch error over a four-cycle grouping of the possible two even events (r=0) and the two possible odd events (r=1) is a constant output offset β given by the following equation:

$$\beta = \frac{e_{106\_1} + e_{106\_2}}{2} \quad (2)$$

where $e_{106\_1}=G_{106\_1}-G$ is the quantization error of the element $106_1$, and $e_{106\_2}=G_{106\_2}-G$ is the quantization error of the element $106_2$, such that the mismatch error of the second DAC segment 96 is effectively converted into the constant offset error β (as described above $e_{106\_1}$ and $e_{106\_2}$ can be positive or negative).

As described above, because the mismatch errors of the first and second DAC segments 94 and 96 are, at least ideally, converted into a constant gain error and a constant offset error β, respectively, the mismatch error introduced by component mismatch in the first and second DAC segments is effectively eliminated, and, therefore, adds no nonlinearity noise that degrades the SNR of the segmented DAC 90, or of a sigma-delta ADC that incorporates the segmented DAC.

But because the DAC elements $106_1$ and $106_2$ of the second DAC segment 96 are sometimes "swapped" into the first DAC segment 94 as described above to obtain the constant offset β for the second DAC segment, the effective gain error of the first DAC segment is, in actuality, not constant, and, therefore, this non-constant gain error does add some non-linearity noise that does degrade the SNR of the 5-bit version of the segmented DAC 90. Specifically, the normalized gain α of the first DAC segment 94 is given by the following equation:

$$\alpha = 1 + \frac{e_{104\_1} + \ldots + e_{104\_15}}{den} \quad (3)$$

where the rightmost term of the right side of equation (3) is the gain error, and den (short for "denominator") has a variation depending upon the sequence of input numbers from the quantizer 18 (FIG. 1) to the 5-bit version of the segmented feedback DAC 90. For example, if the sequence from the quantizer 18 is of all similar numbers, for example, 4, 4, 4, . . . 4, or 7, 7, 7, . . . , 7, then den is given by the following equation:

$$den = \left\{ x * \frac{15}{\text{quotient}\left(\frac{x}{2}\right)} * \text{remainder}\left(\frac{x}{2}\right) \right\} + \quad (4)$$

$$\left\{ x * \frac{15}{\text{quotient}\left(\frac{x}{2}\right) - \frac{1}{2}} * \left| \text{remainder}\left(\frac{x}{2}\right) - 1 \right| \right\}$$

where, for example, quotient (5/2)=2 and remainder (5/2)=1.

The range of the gain α for any sequence of numbers from the quantizer 18 (FIG. 1) is as follows:

$$\alpha = 1 + \frac{e_{104\_1} + \ldots + e_{104\_15}}{60} \text{ to } \alpha = 1 + \frac{e_{104\_1} + \ldots + e_{104\_15}}{31} \quad (5)$$

(i.e., 31≤den≤60, where den may take on a non-integer value within this range).

Furthermore, per equation (2), the offset error for the 5-bit version of the segmented DAC 90 is $$\beta = \frac{e_{106\_1} + e_{106\_2}}{2},$$

which is constant for any sequence whatsoever; the offset β includes nonzero terms only from the mismatch errors of the elements of the second DAC segment 96.

If there is a sufficiently "busy" input signal to the sigma-delta ADC 10 (FIG. 1), the output of the quantizer 18 (FIG. 1) varies significantly such as in the sequence (4, 5, 6, ..., 29, 4, 5, 6, ..., 29, ...). For such a quantizer sequence, the gain α of the first segment 94 of the 5-bit version of the DAC 90, when the DAC 90 is used as the feedback DAC 22 of the ADC 10 of FIG. 1, is, or is close to:

$$\alpha = 1 + \frac{e_{104\_1} + \ldots + e_{104\_15}}{31} \quad (6)$$

That is, den is, or is close to, 31, which is at the lower end of the den range, thus allowing the gain α to approach the gain of a 5-bit DWA DAC per equation (1) above. Or, viewed another way, for a "busy" quantizer sequence, the gain error (the rightmost term of the right side of equation (6)) of the first segment 94 of the 5-bit version of the segmented DAC 90 approaches the gain error of a 5-bit non-segmented DWA DAC.

If there is a mismatch error of no more than 1% (i.e., $G_{104\_x} - G \leq \pm 0.01 \cdot G$ and $G_{106\_x} - 2G \leq \pm 0.01 \cdot 2G$) with the elements 104 and 106 of the first and second DAC segments 94 and 96, then, as described above, the variation of the first-segment gain α, and, therefore, the variation in the linear distortion in the output of the 5-bit segmented DAC 90, will depend upon the sequence of values input to the DAC. But extensive MATLAB simulations have shown that for a mismatch error of not more than 1%, the SNR of the ADC 10 (FIG. 1), when incorporating the DAC 90 as the feedback DAC 22, remains better than 120 dB. This implies that the variation in the gain error (the right-most term on the right side of equation (6) above) is below −120 dB.

Furthermore, if the gain α of the first segment 94 of the 5-bit version of the DAC 90 varies from $\alpha_1$ to $\alpha_2$, then the noise introduced into the output ANALOG_OUT of the ADC 10 (FIG. 1) by the feedback DAC is given by the following equation:

$$20 * \log 10 \left\{ \frac{\alpha_1 - \alpha_2}{\text{oversampling rate}} \right\} \quad (7)$$

If the gain α varies between more than two values, then the expression for the introduced noise may be more complex, but the SNR of ANALOG_OUT will still remain better than 120 dB for the ADC 10 using, as the feedback DAC 22, the 5-bit version of the segmented DAC 90 at an oversampling rate of at least 128.

Referring to FIGS. 7-8, alternate embodiments of the 5-bit version of the segmented DAC 90 are contemplated. For example, instead of the DAC current-source elements 104 and 106, the first and second DAC segments 94 and 96 may include capacitor elements or other types of DAC elements.

Figure 10:
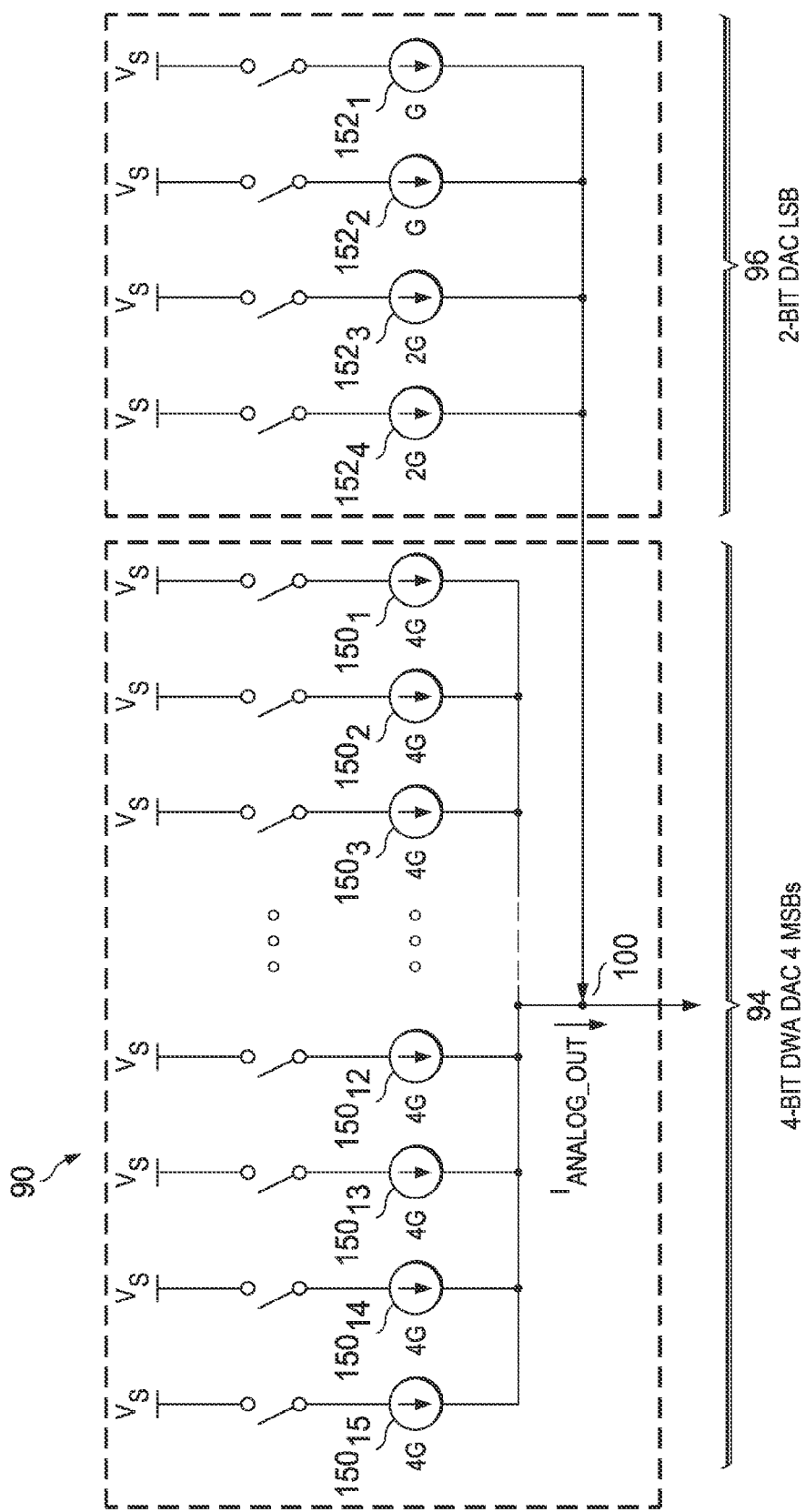
FIG. 10 is a diagram of the segments of a 6-bit version of the segmented DAC of FIG. 7, according to an embodiment.

FIG. 10 is a diagram of the first and second DAC segments 94 and 96 and the combiner 100 of a 6-bit current-output version of the DAC 90 of FIG. 7, according to an embodiment where N=6, m=4, and p=2.

The 4-bit first segment 94, which may be similar to the 4-bit first segment 94 of the 5-bit version of the DAC 90 of FIG. 7, provides the component of $I_{analog\_out}$ corresponding to the four MSBs of the digital input signal x, and includes fifteen DAC current-source elements $150_1$-$150_{15}$ each having a gain of approximately 4G, which is the ideal gain of each element 150. Specifically, each current element $150_x$ has a gain of $4G+e_x$, where $e_x$ is the gain error and may be a positive or negative value. For example, $e_x$ may be in the range of 0%-±5% of 4G.

The second segment 96 provides the component of $I_{analog\_out}$ corresponding to the two LSBs of the digital input signal x, and includes four DAC current-source elements $152_1$-$152_4$. The current-source elements $152_1$-$152_2$ have a gain of approximately G, which is the ideal gain of these elements and which is ¼ of the ideal gain 4G of each of the current elements 150 of the first segment 94. Specifically, each element $152_1$-$152_2$ has a gain of $G+e_x$, where $e_x$ is the gain error and may be a positive or negative value. For example, $e_x$ may be in the range of 0%-±5% of G. And the current elements $152_3$-$152_4$ each have a gain of approximately 2G, which is the ideal gain of these elements and which is ½ of the ideal gain 4G of each of the current elements 150 of the first segment 94. Specifically, each current element $152_3$-$152_4$ has a gain of $2G+e_x$, where $e_x$ is the gain error and may be a positive or negative value. For example, $e_x$ may be in the range of 0%-±5% of 2G. The reason for this gain scaling between the first and second segments 94 and 96 is that the component of $I_{analog\_out}$ provided by the elements $152_1$-$152_4$ corresponds to the $2^0$ and $2^1$ bit positions of the value x of the digital input signal, and the components of $I_{analog-out}$ respectively provided by the elements 150 correspond to the $2^2$ bit position of x.

And the combiner 100 is a current-summing node to which the outputs of all of the current elements 150 and 152 are coupled.

Even though the 6-bit version of the segmented DAC 90 of FIGS. 7 and 10 includes two additional current elements $152_4$, $152_3$, and $152_2$ (for a total of 19 elements 150 and 152 and 19 lines that carry the currents generated by these elements) as compared to a standard 6-bit segmented DAC, which would have 17 DAC elements and lines, this is still significantly fewer than the 63 DAC elements that a 6-bit DWA DAC includes.

In general, as described in more detail below, the 6-bit version of the DAC 90 generates $I_{analog\_out}$ with less non-linear distortion than a 6-bit version of the segmented DAC 70 of FIG. 5 by sometimes swapping two, three, or four of the current-source elements 152 of the second segment 96 for one of the current-source elements 150 of the first segment 94. The controller 102 (FIG. 7) operates the 4-bit first DAC segment 94 in a DWA fashion, but sometimes, instead of activating all of the elements 150 needed to generate the first component of $I_{analog\_out}$ in response to q, the controller deactivates, or maintains inactive, one of these elements 150, and, in its place, activates at least one (e.g., two or three) of the current elements 152.

Table II describes the activation of the DAC elements 152 of the second DAC segment 96 of FIG. 10 versus the present value and cycle position of r, according to an embodiment.

TABLE II

| q | r | r cycle position | DAC element $152_4$ | DAC element $152_3$ | DAC element $152_2$ | DAC element $152_1$ |
|---|---|---|---|---|---|---|
| 0 | 0 | Don't care | Inactive | Inactive | Inactive | Inactive |
| ≠0 | 0 | 1$^{st}$ position | Inactive | Inactive | Inactive | Inactive |
| ≠0 | 0 | 2$^{nd}$ position | Inactive | Active and Swapped | Active and Swapped | Active and Swapped |
| ≠0 | 0 | 3$^{rd}$ position | Active and Swapped | Inactive | Active and Swapped | Active and Swapped |
| ≠0 | 0 | 4$^{th}$ position | Active and Swapped | Active and Swapped | Inactive | Inactive |
| ≠0 | 1 | 1$^{st}$ position | Inactive | Inactive | Inactive | Active But not swapped |
| ≠0 | 1 | 2$^{nd}$ position | Inactive | Inactive | Active But not swapped | Inactive |
| ≠0 | 1 | 3$^{rd}$ position | Active and Swapped | Active and Swapped | Inactive | Active But Not Swapped |
| ≠0 | 1 | 4$^{th}$ position | Active and Swapped | Active and Swapped | Active But Not Swapped | Inactive |
| ≠0 | 2 | 1$^{st}$ position | Inactive | Inactive | Active But not swapped | Active But not swapped |
| ≠0 | 2 | 2$^{nd}$ position | Inactive | Active But not swapped | Inactive | Inactive |
| ≠0 | 2 | 3$^{rd}$ position | Active But not swapped | Inactive | Inactive | Inactive |
| ≠0 | 2 | 4$^{th}$ position | Active and swapped | Active and swapped | Active But not swapped | Active But not swapped |
| ≠0 | 3 | 1$^{st}$ position | Inactive | Active But not swapped | Inactive | Active But not swapped |
| ≠0 | 3 | 2$^{nd}$ position | Active But not swapped | Inactive | Inactive | Active But not swapped |
| ≠0 | 3 | 3$^{rd}$ position | Inactive | Active But not swapped | Active But not swapped | Inactive |
| ≠0 | 3 | 4$^{th}$ position | Active But not swapped | Inactive | Active But not swapped | Inactive |

One can make the following observations from Table II. When x=q=r=0, then the DAC elements 150 and 152 are all inactive, and, therefore, no swapping occurs regardless of the cycle position of r. Furthermore, because the gain of each element 150 is approximately two times the gain of each element $152_3$ and $152_4$, and is approximately four times the gain of each element $152_1$ and $152_2$, the only combinations of the elements 152 that can be swapped into the first DAC segment 94 are: $152_3$ and $152_4$; $152_1$, $152_2$, and $152_3$; and $152_1$, $152_2$, and $152_4$.

Still referring to Table II, in summary, by alternately swapping the elements 152 for an element 150, and by alternately activating the elements $152_1$, $152_2$, $152_3$, and $152_4$, the controller 102 operates the first DAC segment 94 in a DWA fashion, and operates the second DAC segment 96 in a manner that pushes the non-linearity noise caused by the element mismatches in, and the gain differences between, the DAC segments 94 and 96 to higher frequencies so that more of this noise can be removed by the filter and decimator 20 of FIG. 1 as compared to the segmented DAC 70 of FIG. 5.

FIGS. 11A-11D are flow diagrams of the operation of the 6-bit version of the segmented DAC 90 of FIGS. 7 and 10, according to an embodiment.

Referring to FIGS. 7, 10, and 11A-11D, the operation of the 6-bit version of the DAC 90 is described, according to an embodiment.

At a step 160, the controller 102 divides the digital input value x by $2^P=2^2=4$ to generate a 4-bit quotient q and a 2-bit remainder r.

Figure 11A:
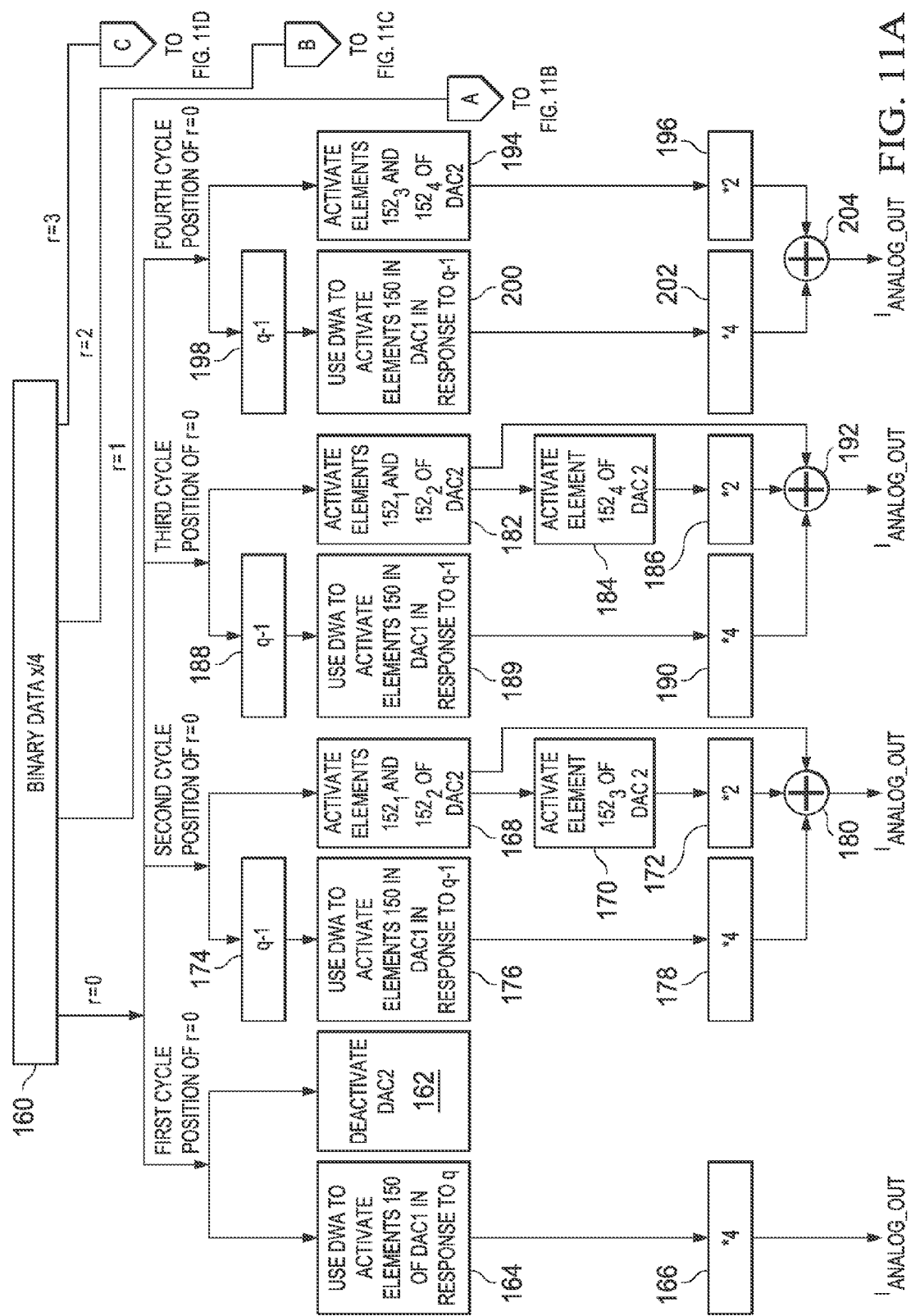

During a first sequence, or cycle, position for r=0, at step 162 the controller 102 deactivates the second DAC segment 96 (DAC2 in FIG. 11A).

At step 164, the controller 102 determines how many of the current elements 150 of the first DAC segment 94 (DAC1 in FIG. 11) are to be activated in response to q (y=0 because there is no swapping), determines which of the elements to activate using DWA, and then activates these elements. For example, if q=0101, then the controller 102 determines that five of the elements 150 are to be activated.

Next, the controller 102 uses DWA to determine which five of the current elements 150 to activate, and activates these five current elements.

Then, at step 166, the first DAC segment 94 effectively multiplies by approximately four the signal generated by the active elements 150 to generate $I_{analog\_output}$ (because the second DAC segment 96 is inactive, the first DAC segment generates $I_{analog\_out}$ in its entirety). As described above, this multiply by four is because the elements 150 each represent a bit in the $2^2=4$ bit position, and is inherently effected by the gains of the DAC elements 150 of the first DAC segment 94 being approximately four times the gains of the DAC elements $152_1$ and $152_2$, and twice the gains of the DAC elements $152_3$ and $152_4$, of the second DAC segment 96.

During a second cycle position for r=0, at step 168 the controller 102 activates the elements $152_1$, and $152_2$, and at a step 170 activates the element $152_3$, of the second DAC segment 96 (DAC2 in FIG. 11A) to generate a second component of $I_{analog\text{-}out}$—as described above, however, the controller 102 deactivates the elements $152_1$, $152_2$, and $152_3$ if q=x=r=0.

At step 172, the second DAC segment 96 effectively multiplies by approximately two the signal generated by the active element $152_3$. As described above, this multiply by two is because the element $152_3$ represents a bit in the $2^1=2$ bit position, and is inherently effected by the gain of the DAC element $152_3$ being approximately twice the gains of each of the DAC elements $152_1$ and $152_2$.

At step 174, the controller 102 sets y=1 because the active elements $152_1$, $152_2$, and $152_3$ take the place of one of the current elements 150 that the controller would otherwise activate in response to q.

Then, at step 176, the controller 102 determines how many of the current elements 150 of the first DAC segment 94 (DAC1 in FIG. 11A) are to be activated in response to q−1, determines which of the elements to activate using DWA, and then activates these elements. For example, if q=0101, then q−0001=0100 and the controller 102 determines that four of the current elements 150 are to be activated. Next, the controller 102 uses DWA to determine which four of the current elements 150 to activate, and activates these four current elements.

Then, at step 178, the first DAC segment 94 effectively multiplies by approximately four the signal generated by the active elements 150 to generate a first component of $I_{analog\_output}$. As described above, this multiply by four is because the elements 150 each represent a bit in the $2^2$ bit position, and is inherently effected by the gains of the DAC elements 150 of the first DAC segment 94 being approximately twice the gains of the DAC elements $152_3$ and $152_4$, and approximately four times the gains of the DAC elements $152_1$ and $152_2$, of the second DAC segment 96.

Next, at step 180, the first and second components of $I_{analog\_out}$ are summed at the summing node 100 to generate $I_{analog\_out}$.

During a third cycle position for r=0, at step 182 the controller 102 activates the elements 152$_1$, and 152$_2$, and at a step 184 activates the element 152$_4$, of the second DAC segment 96 (DAC2 in FIG. 11A) to generate a second component of I$_{analog\_out}$—as described above, however, the controller 102 deactivates the elements 152$_1$, 152$_2$, and 152$_3$ if q=x=r=0.

At step 186, the second DAC segment 96 effectively multiplies by approximately two the signal generated by the active element 152$_4$. As described above, this multiply by two is because the element 152$_4$ represents a bit in the $2^1$ bit position, and is inherently effected by the gain of the DAC elements 152$_4$ of the second DAC segment 96 being approximately twice the gains of each of the DAC elements 152$_1$ and 152$_2$ of the second DAC segment.

At step 188, the controller 102 sets y=1 because the active elements 152$_1$, 152$_2$, and 152$_4$ take the place of one of the current elements 150 that the controller would otherwise activate in response to q.

Then, at step 189, the controller 102 determines how many of the current elements 150 of the first DAC segment 94 (DAC1 in FIG. 11A) are to be activated in response to q−1, determines which of the elements to activate using DWA, and then activates these elements. For example, if q=0101, then q−0001=0100 and the controller 102 determines that four of the current elements 150 are to be activated. Next, the controller 102 uses DWA to determine which four of the elements 150 to activate, and activates these four elements.

Next, at step 190, the first DAC segment 94 effectively multiplies by approximately four the signal generated by the active elements 150 to generate a first component of I$_{analog\_output}$. As described above, this multiply by four is because the elements 150 each represent a bit in the $2^2$ bit position, and is inherently effected by the gains of the DAC elements 150 of the first DAC segment 94 being approximately twice the gains of the DAC elements 152$_3$ and 152$_4$, and approximately four times the gains of the DAC elements 152$_1$ and 152$_2$, of the second DAC segment 96.

Then, at step 192, the first and second components of I$_{analog\_out}$ are summed at the summing node 100 to generate I$_{analog\_out}$.

And during a fourth cycle position for r=0, at step 194 the controller 102 activates the elements 152$_3$ and 152$_4$ of the second DAC segment 96 (DAC2 in FIG. 11) to generate a second component of I$_{analog\-out}$—as described above, however, the controller 102 deactivates the elements 152$_3$ and 152$_4$ if q=x=r=0.

At step 196, the second DAC segment 96 effectively multiplies by approximately two the signal generated by the active elements 152$_3$ and 152$_4$. As described above, this multiply by two is because the elements 152$_3$ and 152$_4$ each represent a bit in the $2^1$ bit position, and is inherently effected by the gain of the DAC elements 152$_3$ and 152$_4$ being approximately twice the gains of the DAC elements 152$_1$ and 152$_2$ also of the second DAC segment 96.

At step 198, the controller 102 sets y=1 because the active elements 152$_3$ and 152$_4$ take the place of one of the current elements 150 that the controller would otherwise activate in response to q.

Then, at step 200, the controller 102 determines how many of the current elements 150 of the first DAC segment 94 (DAC1 in FIG. 1) are to be activated in response to q−1, determines which of the elements to activate using DWA, and then activates these elements. For example, if q=0101, then q−0001=0100 and the controller 102 determines that four of the elements 150 are to be activated. Next, the controller 102 uses DWA to determine which four of the elements 150 to activate, and activates these four elements.

Next, at step 202, the first DAC segment 94 effectively multiplies by approximately four the signal generated by the active elements 150 to generate a first component of I$_{analog\_output}$. As described above, this multiply by four is because the elements 150 each represent a bit in the $2^2$ bit position, and is inherently effected by the gains of the DAC elements 150 being approximately twice the gains of the DAC elements 152$_3$ and 152$_4$, and approximately four times the gains of the DAC elements 152$_1$ and 152$_2$, of the second DAC segment 96.

Then, at step 204, the first and second components of I$_{analog\_out}$ are summed at the summing node 100 to generate I$_{analog\_out}$.

The controller 102 keeps track of the cycle positions for r, and repeats the above-described sequential, cyclic procedure for subsequent occurrences of r=0.

Referring to FIG. 11B, during a first sequence, or cycle, position for r=1, at step 206 the controller 102 activates the element 152$_1$ of the second DAC segment 96 (DAC2 in FIG. 11B) to generate a second component of I$_{analog\-out}$.

At step 208, the controller 102 determines how many of the current elements 150 of the first DAC segment 94 (DAC1 in FIG. 11) are to be activated in response to q (y=0 because no elements 152 are being swapped for an element 150), determines which of the elements to activate using DWA, and then activates these elements. For example, if q=0101, then the controller 102 determines that five of the current elements 150 are to be activated. Next, the controller 102 uses DWA to determine which five of the current elements 150 to activate, and activates these five current elements.

Then, at step 210, the first DAC segment 94 effectively multiplies by approximately four the signal generated by the active elements 150 to generate I$_{analog\_output}$. As described above, this multiply by four is because the elements 150 each represent a bit in the $2^2$ bit position, and is inherently effected by the gains of the DAC elements 150 of the first DAC segment 94 being approximately four times the gains of the DAC elements 152$_1$ and 152$_2$, and twice the gains of the DAC elements 152$_3$ and 152$_4$, of the second DAC segment 96.

Next, at step 212, the first and second components of I$_{analog\_out}$ are summed at the summing node 100 to generate I$_{analog\_out}$.

During a second cycle position for r=1, at step 214 the controller 102 activates the element 152$_2$ of the second DAC segment 96 (DAC2 in FIG. 11B) to generate a second component of I$_{analog\-out}$.

At step 216, the controller 102 determines how many of the current elements 150 of the first DAC segment 94 (DAC1 in FIG. 11) are to be activated in response to q (y=0 because no elements 152 are being swapped for an element 150), determines which of the elements to activate using DWA, and then activates these elements. For example, if q=0101, then the controller 102 determines that five of the current elements 150 are to be activated. Next, the controller 102 uses DWA to determine which five of the current elements 150 to activate, and activates these five current elements.

Then, at step 218, the first DAC segment 94 effectively multiplies by approximately four the signal generated by the active elements 150 to generate I$_{analog\_output}$. As described above, this multiply by four is because the elements 150 each represent a bit in the $2^2$ bit position of x, and is inherently effected by the gains of the DAC elements 150 of the first DAC segment 94 being approximately four times the gains of the DAC elements 152$_1$ and 152$_2$, and twice the gains of the DAC elements 152$_3$ and 152$_4$, of the second DAC segment 96.

Next, at step 220, the first and second components of I$_{analog\_out}$ are summed at the summing node 100 to generate I$_{analog\_out}$.

During a third cycle position for r=1, at step 222 the controller 102 activates the element $152_1$, and at a step 224 activates the elements $152_3$ and $152_4$, of the second DAC segment 96 (DAC2 in FIG. 11B) to generate a second component of $I_{analog-out}$.

At step 226, the second DAC segment 96 effectively multiplies by approximately two the signals generated by the active elements $152_3$ and $152_4$. As described above, this multiply by two is because the elements $152_3$ and $152_4$ each represent a bit in the $2^1$ bit position, and is inherently effected by the gain of the DAC elements $152_3$ and $152_4$ being approximately twice the gains of the DAC elements $152_1$ and $152_2$ also of the second DAC segment.

At step 228, the controller 102 sets y=1 because the active elements $152_3$ and $152_4$ take the place of one of the current elements 150 that the controller would otherwise activate in response to q.

Then, at step 230, the controller 102 determines how many of the current elements 150 of the first DAC segment 94 (DAC1 in FIG. 1) are to be activated in response to q−1, determines which of the elements to activate using DWA, and then activates these elements. For example, if q=0101, then q−0001=0100 and the controller 102 determines that four of the current elements 150 are to be activated. Next, the controller 102 uses DWA to determine which four of the current elements 150 to activate, and activates these four current elements.

Next, at step 232, the first DAC segment 94 effectively multiplies by approximately four the signal generated by the active elements 150 to generate a first component of $I_{analog\_output}$. As described above, this multiply by four is because the elements 150 each represent a bit in the $2^2$ bit position, and is inherently effected by the gains of the DAC elements 150 of the first DAC segment 94 being approximately twice the gains of the DAC elements $152_3$ and $152_4$, and approximately four times the gains of the DAC elements $152_1$ and $152_2$, of the second DAC segment 96.

Next, at step 234, the first and second components of $I_{analog\_out}$ are summed at the summing node 100 to generate $I_{analog\_out}$.

And during a fourth cycle position for r=1, at step 236 the controller 102 activates the element $152_2$, and at a step 238 activates the elements $152_3$ and $152_4$, of the second DAC segment 96 (DAC2 in FIG. 11B) to generate a second component of $I_{analog-out}$.

At step 240, the second DAC segment 96 effectively multiplies by approximately two the signals generated by the active elements $152_3$ and $152_4$. As described above, this multiply by two is because the elements $152_3$ and $152_4$ each represent a bit in the $2^1$ bit position, and is inherently effected by the gain of the DAC elements $152_3$ and $152_4$ being approximately twice the gains of the DAC elements $152_1$ and $152_2$ also of the second DAC segment.

At step 242, the controller 102 subtracts sets y=1 because the active elements $152_3$ and $152_4$ take the place of one of the current elements 150 that the controller would otherwise activate in response to q.

Then, at step 244, the controller 102 determines how many of the current elements 150 of the first DAC segment 94 (DAC1 in FIG. 1) are to be activated in response to q−1, determines which of the elements to activate using DWA, and then activates these elements. For example, if q=0101, then q−0001=0100 and the controller 102 determines that four of the current elements 150 are to be activated. Next, the controller 102 uses DWA to determine which four of the current elements 150 to activate, and activates these four current elements.

Next, at step 246, the first DAC segment 94 effectively multiplies by approximately four the signal generated by the active elements 150 to generate a first component of $I_{analog\_output}$. As described above, this multiply by four is because the elements 150 each represent a bit in the $2^2$ bit position, and is inherently effected by the gains of the DAC elements 150 of the first DAC segment 94 being approximately twice the gains of the DAC elements $152_3$ and $152_4$, and approximately four times the gains of the DAC elements $152_1$ and $152_2$, of the second DAC segment 96.

Then, at step 248, the first and second components of $I_{analog\_out}$ are summed at the summing node 100 to generate $I_{analog\_out}$.

The controller 102 keeps track of the cycle positions for r, and repeats the above-described sequential, cyclic procedure of FIG. 11B for subsequent occurrences of r=1.

Figure 11C:
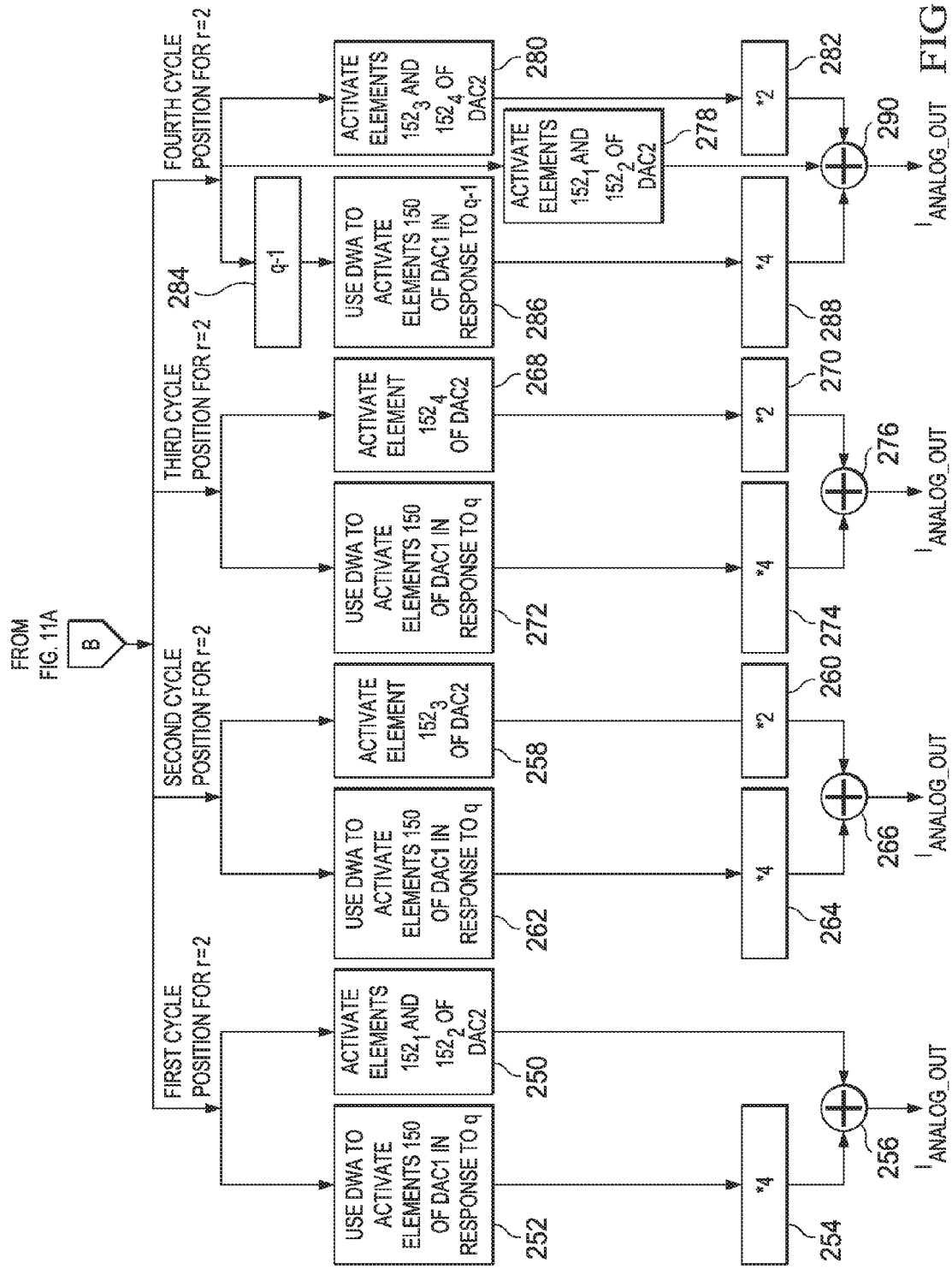

Referring to FIG. 11C, during a first cycle position for r=2, at step 250 the controller 102 activates the elements $152_1$ and $152_2$ of the second DAC segment 96 (DAC2 in FIG. 11C) to generate a second component of $I_{analog-out}$.

At step 252, the controller 102 determines how many of the current elements 150 of the first DAC segment 94 (DAC1 in FIG. 11C) are to be activated in response to q (y=0 because no elements 152 are swapped for an element 150), determines which of the elements to activate using DWA, and then activates these elements.

Then, at step 254, the first DAC segment 94 effectively multiplies by approximately four the signal generated by the active elements 150 to generate $I_{analog\_output}$.

Next, at step 256, the first and second components of $I_{analog\_out}$ are summed at the summing node 100 to generate $I_{analog\_out}$.

During a second cycle position for r=2, at step 258 the controller 102 activates the element $152_3$ of the second DAC segment 96 (DAC2 in FIG. 11C).

At step 260, the second DAC segment 96 effectively multiplies by approximately two the signal generated by the active element $152_3$ to generate a second component of $I_{analog-out}$.

At step 262, the controller 102 determines how many of the current elements 150 of the first DAC segment 94 (DAC1 in FIG. 11) are to be activated in response to q (y=0 because no elements 152 are swapped for an element 150), determines which of the elements to activate using DWA, and then activates these elements.

Then, at step 264, the first DAC segment 94 effectively multiplies by approximately four the signal generated by the active elements 150 to generate $I_{analog\_output}$.

Next, at step 266, the first and second components of $I_{analog\_out}$ are summed at the summing node 100 to generate $I_{analog\_out}$.

During a third cycle position for r=2, at step 268 the controller 102 activates the element $152_4$ of the second DAC segment 96 (DAC2 in FIG. 11C).

At step 270, the second DAC segment 96 effectively multiplies by approximately two the signal generated by the active element $152_4$ to generate a second component of $I_{analog-out}$.

At step 272, the controller 102 determines how many of the current elements 150 of the first DAC segment 94 (DAC1 in FIG. 11) are to be activated in response to q (y=0), determines which of the elements to activate using DWA, and then activates these elements.

Then, at step 274, the first DAC segment 94 effectively multiplies by approximately four the signal generated by the active elements 150 to generate $I_{analog\_output}$.

Next, at step 276, the first and second components of $I_{analog\_out}$ are summed at the summing node 100 to generate $I_{analog\_out}$.

And during a fourth cycle position for r=2, at step 278 the controller 102 activates the elements $152_1$ and $152_2$, and at a step 280 activates the elements $152_3$ and $152_4$, of the second DAC segment 96 (DAC2 in FIG. 11C) to generate a second component of $I_{analog\text{-}out}$.

At step 282, the second DAC segment 96 effectively multiplies by approximately two the signals generated by the active elements $152_3$ and $152_4$.

At step 284, the controller 102 sets y=1 because the active elements $152_3$ and $152_4$ take the place of one of the current elements 150 that the controller would otherwise activate in response to q.

Then, at step 286, the controller 102 determines how many of the current elements 150 of the first DAC segment 94 (DAC1 in FIG. 11C) are to be activated in response to q−1, determines which of the elements to activate using DWA, and then activates these elements.

Next, at step 288, the first DAC segment 94 effectively multiplies by approximately four the signal generated by the active elements 150 to generate a first component of $I_{analog\_output}$.

Then, at step 290, the first and second components of $I_{analog\_out}$ are summed at the summing node 100 to generate $I_{analog\_out}$.

The controller 102 keeps track of the cycle positions for r, and repeats the above-described sequential, cyclic procedure of FIG. 11C for subsequent occurrences of r=2.

Figure 11D:
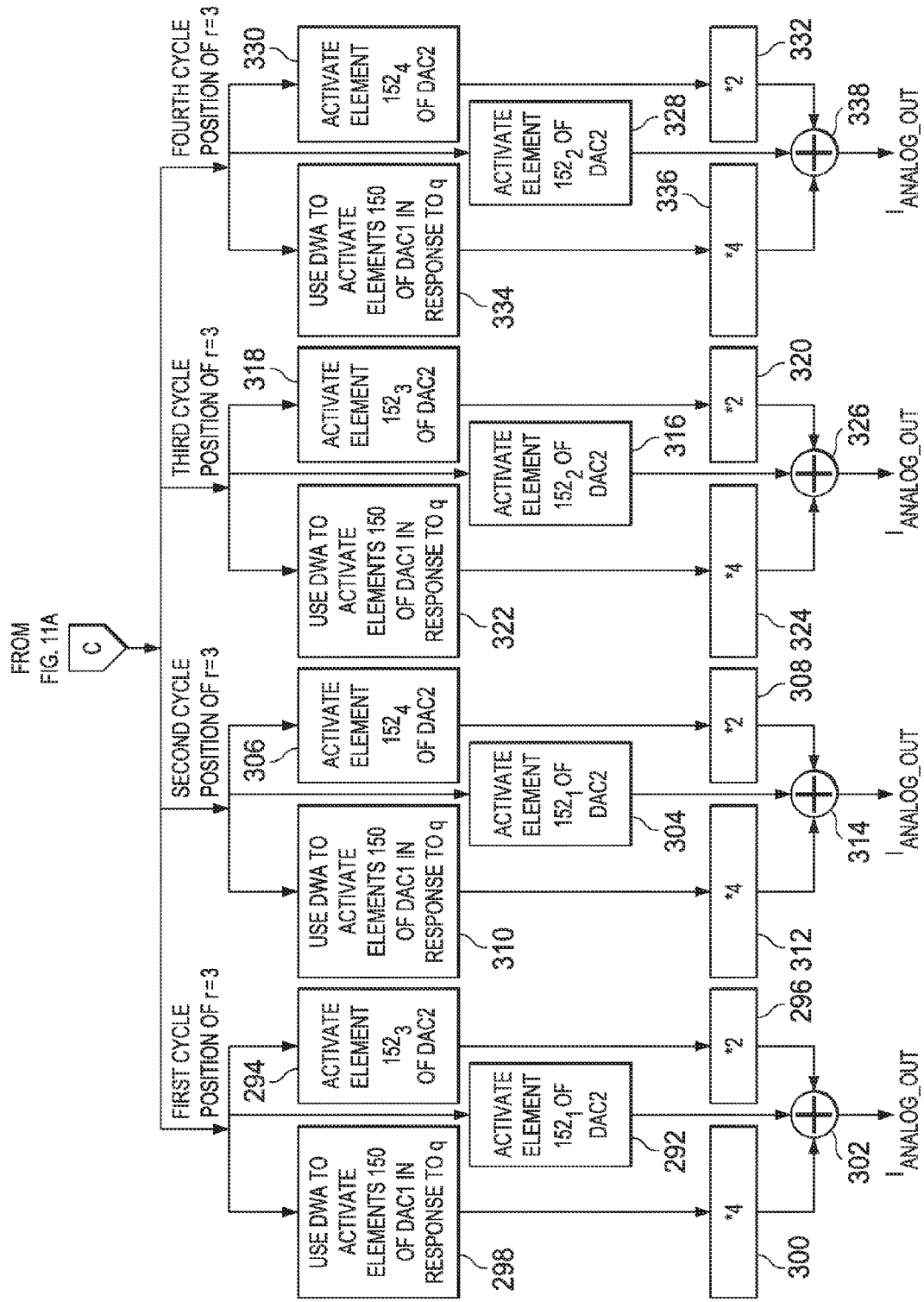

Referring to FIG. 11D, during a first cycle position for r=3, at step 292 the controller 102 activates the element $152_1$, and at a step 294 activates the element $152_3$, of the second DAC segment 96 (DAC2 in FIG. 11D) to generate a second component of $I_{analog\text{-}out}$.

At step 296, the second DAC segment 96 effectively multiplies by approximately two the signal generated by the active element $152_3$.

At step 298, the controller 102 determines how many of the current elements 150 of the first DAC segment 94 (DAC1 in FIG. 11D) are to be activated in response to q (y=0), determines which of the elements to activate using DWA, and then activates these elements.

Then, at step 300, the first DAC segment 94 effectively multiplies by approximately four the signal generated by the active elements 150 to generate $I_{analog\_output}$.

Next, at step 302, the first and second components of $I_{analog\_out}$ are summed at the summing node 100 to generate $I_{analog\_out}$.

During a second cycle position for r=3, at step 304 the controller 102 activates the element $152_1$, and at a step 306 activates the element $152_4$, of the second DAC segment 96 (DAC2 in FIG. 11D) to generate a second component of $I_{analog\text{-}out}$.

At step 308, the second DAC segment 96 effectively multiplies by approximately two the signal generated by the active element $152_4$.

At step 310, the controller 102 determines how many of the current elements 150 of the first DAC segment 94 (DAC1 in FIG. 11D) are to be activated in response to q (y=0), determines which of the elements to activate using DWA, and then activates these elements.

Then, at step 312, the first DAC segment 94 effectively multiplies by approximately four the signal generated by the active elements 150 to generate $I_{analog\_output}$.

Next, at step 314, the first and second components of $I_{analog\_out}$ are summed at the summing node 100 to generate $I_{analog\_out}$.

During a third cycle position for r=3, at step 316 the controller 102 activates the element $152_2$, and at a step 318 activates the element $152_3$, of the second DAC segment 96 (DAC2 in FIG. 11D) to generate a second component of $I_{analog\text{-}out}$.

At step 320, the second DAC segment 96 effectively multiplies by approximately two the signal generated by the active element $152_3$.

At step 322, the controller 102 determines how many of the current elements 150 of the first DAC segment 94 (DAC1 in FIG. 11) are to be activated in response to q (y=0 because no elements 152 are swapped for an element 150), determines which of the elements to activate using DWA, and then activates these elements.

Then, at step 324, the first DAC segment 94 effectively multiplies by approximately four the signal generated by the active elements 150 to generate a first component of $I_{analog\_output}$.

Next, at step 326, the first and second components of $I_{analog\_out}$ are summed at the summing node 100 to generate $I_{analog\_out}$.

And during a fourth cycle position for r=3, at step 328 the controller 102 activates the element $152_2$, and at a step 330 activates the element $152_4$, of the second DAC segment 96 (DAC2 in FIG. 11D) to generate a second component of $I_{analog\text{-}out}$.

At step 332, the second DAC segment 96 effectively multiplies by approximately two the signal generated by the active element $152_4$.

At step 334, the controller 102 determines how many of the current elements 150 of the first DAC segment 94 (DAC1 in FIG. 11) are to be activated in response to q (y=0 because no elements 152 are being swapped for an element 150), determines which of the elements to activate using DWA, and then activates these elements.

Then, at step 336, the first DAC segment 94 effectively multiplies by approximately four the signal generated by the active elements 150 to generate a first component of $I_{analog\_output}$.

Next, at step 338, the first and second components of $I_{analog\_out}$ are summed at the summing node 100 to generate $I_{analog\_out}$.

The controller 102 keeps track of the cycle positions for r, and repeats the above-described sequential, cyclic procedure of FIG. 11D for subsequent occurrences of r=3.

Still referring to FIGS. 7, 10, and 11, as described above, the first DAC segment 94 of the 6-bit version of the segmented DAC 90 uses DWA to average/remove the non-linearity caused by its mismatch error by converting the mismatch error to a constant gain error, at least ideally.

For the second DAC segment 96, the average mismatch error over a sixteen-cycle grouping of the possible four events for each of r=0, r=1, r=2, and r=3, respectively, is a constant offset given by the following equation:

$$\beta = \frac{e_{152\_1} + e_{152\_2} + e_{152\_3} + e_{152\_4}}{4} \quad (8)$$

where $e_{152\_1} = G_{152\_1} - G$ is the quantization error of the element $152_1$, $e_{152\_2} = G_{152\_2} - G$ is the quantization error of the element $152_2$, $e_{152\_3} = G_{152\_3} - 2G$ is the quantization error of the element $152_3$, and $e_{152\_4} = G_{152\_4} - 2G$ is the quantization error of the element $152_4$. Per equation (8), the mismatch error of the second DAC segment 96 is effectively converted into the constant offset error β (as described above $e_{152\_1}$, $e_{152\_2}$, $e_{152\_3}$, and $e_{152\_4}$ can be positive or negative).

As described above, because the mismatch errors of the first and second DAC segments 94 and 96 are, at least ideally, converted into a constant gain error and a constant offset error β, respectively, the mismatch error introduced by component mismatch in the first and second DAC segments is effectively eliminated, and, therefore, adds no nonlinearity noise that degrades the SNR of the 6-bit version of the segmented DAC 90, or of a sigma-delta ADC that incorporates the segmented DAC.

But because the DAC elements $152_1$, $152_2$, $152_3$, and $152_4$ of the second DAC segment 96 are sometimes "swapped" into the first DAC segment 94 as described above to obtain the constant offset β for the second DAC segment, the effective gain error of the first DAC segment is, in actuality, not constant, and, therefore, this non-constant gain error may add some non-linearity noise that does degrade the SNR of the 6-bit version of the segmented DAC 90. Specifically, the gain α of the first DAC segment 94 is given by the following equation:

$$\alpha = 1 + \frac{e_{150\_1} + \ldots + e_{150\_15}}{den} \quad (9)$$

where den (short for "denominator") has a variation depending upon the sequence of input numbers from the quantizer 18 (FIG. 1) to the 6-bit version of the segmented feedback DAC 90. For example, if the sequence from the quantizer 18 is of all similar numbers, say (4, 4, 4, . . . 4, or 7, 7, 7, . . . , 7, etc.) then den is given by the following equation:

$$den = \left( x * \frac{15}{\text{quotient}\left(\frac{x}{4}\right) - \left(\frac{3 - \text{remainder}\left(\frac{x}{4}\right)}{4}\right)} \right) \quad (10)$$

where, for example, quotient (6/4)=1 and remainder (6/4)=2.

The range of a for any sequence of numbers from the quantizer 18 (FIG. 1) is as follows:

$$\alpha = 1 + \frac{e_{150\_1} + \ldots + e_{150\_15}}{240} \text{ to } \alpha = 1 + \frac{e_{150\_1} + \ldots + e_{150\_15}}{63} \quad (11)$$

(i.e., 63≤den≤240, where den may take on a non-integer value within this range).

Furthermore, per equation (8), the offset error for the 6-bit version of the segmented DAC 90 is $$\beta = \frac{e_{150\_1} + e_{150\_2} + e_{150\_3} + e_{150\_4}}{2},$$

which is constant for any sequence whatsoever; the offset β includes nonzero terms only from the mismatch errors of the elements of the second DAC segment 96.

If there is a sufficiently "busy" input signal to the sigma-delta ADC 10 (FIG. 1), the output of the quantizer 18 (FIG. 1) varies significantly such as in the sequence (6, . . . , 58, 6, . . . , 58, . . . ). For such a quantizer sequence, the gain α of the 6-bit version of the segmented DAC 90, when used as the feedback DAC 22 of FIG. 1, is, or is close to:

$$\alpha = 1 + \frac{e_{150\_1} + \ldots + e_{150\_15}}{63} \quad (12)$$

That is, den is close to 63, which is at the lower end of the den range of expression (11), and approaches the gain of a 6-bit DWA DAC. Or, viewed another way, for a "busy" quantizer sequence, the gain error (the rightmost term of the right side of equation (12)) of the 6-bit version of the segmented DAC 90 approaches the constant gain error of a 6-bit non-segmented DWA DAC.

If there is a mismatch error of no more than 1% (i.e., $G_{150\_x} - 4G \leq \pm 0.01 \cdot 4G$, $G_{152\_x=3 \text{ or } 4} - 2G \leq \pm 0.01 \cdot 2G$, and $G_{152\_x=1 \text{ or } 2} - G \leq \pm 0.01 \cdot G$) among the elements 150 and 152 of the first and second DAC segments 94 and 96, then the variation of the gain α, and, therefore, the variation in the linear distortion in the output of the 6-bit version of the segmented DAC 90, will depend upon the sequence of values input to the DAC. Extensive MATLAB simulations have shown that for a mismatch error of not more than 1%, the SNR of the ADC 10 (FIG. 1), when incorporating the 6-bit version of the DAC 90 as the feedback DAC 22, remains better than 108 dB. This implies that the variation in the gain error (the right-most term on the right side of equation (9) above) is below −108 dB.

Furthermore, if the gain α of the 6-bit version of the DAC 90 varies between two values $\alpha_1$ to $\alpha_2$, then the noise introduced into the output ANALOG_OUT of the ADC 10 (FIG. 1) by the DAC 90 when used as the feedback DAC is:

$$20 * \log 10 \left\{ \frac{\alpha_1 - \alpha_2}{\text{oversampling rate}} \right\} \quad (13)$$

If the gain α varies between more than two values, then the expression for the introduced noise may be more complex, but the SNR of the ADC 10 (FIG. 1) will still remain better than 108 dB when including the 6-bit version of the segmented DAC 90 at an oversampling rate of at least 128.

Referring to FIGS. 7, 10, and 11, alternate embodiments of the 6-bit version of the segmented DAC 90 are contemplated. For example, the DAC current elements 150 and 152 may be capacitor elements or other types of DAC elements. Furthermore, the controller 102 may perform the above-sequences of steps in different orders.

Figure 12:
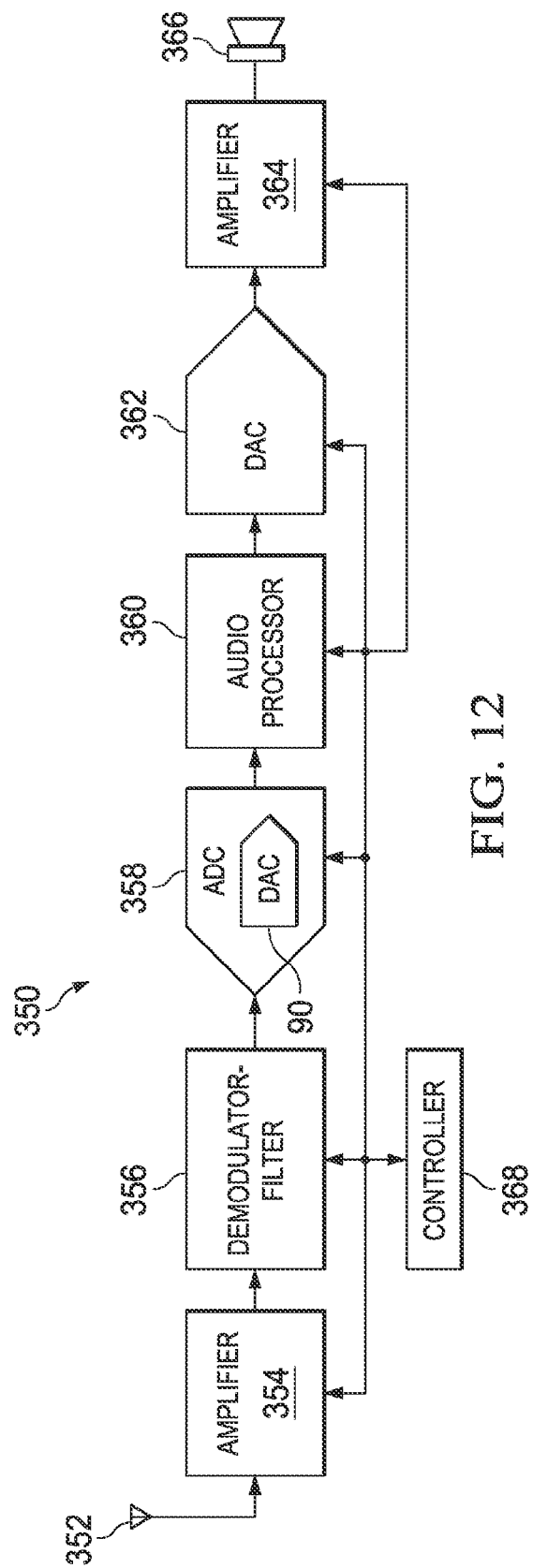
FIG. 12 is a diagram of a system including a sigma-delta ADC that incorporates the segmented DAC of FIG. 7, according to an embodiment.

FIG. 12 is a diagram of an audio system 350, which includes the segmented DAC 90 of FIG. 7, according to an embodiment.

The system 350 includes an antenna 352, input amplifier 354, input demodulator-filter 356, sigma-delta ADC 358, audio processor 360, output DAC 362, output amplifier 364, audio renderer 366, and controller 368 (the controller 368 may be separate from, include, or be part of the controller 102 (FIG. 7) of the DAC 90). The ADC 358 includes the DAC 90 (FIG. 7) as a feedback DAC, and may otherwise be similar to the ADC 10 of FIG. 1. Furthermore, the audio renderer 366 may be one or more speakers.

In operation, the controller 368 controls the aforementioned components of the system 350 such that in an embodiment, the system operates as follows.

The antenna 352 receives an analog signal, such as an AM or FM radio signal, and the amplifier 354 amplifies the signal.

The demodulator-filter demodulates and conditions the amplified analog signal.

The ADC converts the demodulated and conditioned analog signal into a digital signal, and the processor 360 processes the digital signal (e.g., enhances the quality of the signal, or adds audio effects to the signal).

The DAC 362 converts the processed digital audio signal into an analog audio signal, the amplifier 364 amplifiers the analog audio signal, and the renderer 366 renders the amplified analog audio signal.

Still referring to FIG. 12, alternate embodiments of the system 350 are contemplated. For example, the system 350 may be a type of system other than an audio system. Furthermore, although described as including one DAC 90 in the ADC 358, the system 350 may include more than one DAC 90, or may include a DAC 90 that is not part of the ADC.

Even though various embodiments and advantages of the present disclosure have been set forth in the foregoing description, the present disclosure is illustrative only, and changes may be made in detail and yet remain within the broad principles of the present disclosure. Moreover, the functions performed by various components described above can be combined to be performed by fewer elements, separated and performed by more elements, or combined into different functional blocks depending upon the nature of the electronic system to which the present disclosure is being applied, as will be appreciated by those skilled in the art. At least some of the components described above may be implemented using either digital or analog circuitry, or a combination of both, and also, where appropriate, may be realized through software executing on suitable processing circuitry. It should also be noted that the functions performed by various components discussed above can be combined and performed by fewer elements or separated and performed by additional elements depending on the nature of the DAC 90 of FIG. 7.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A digital-to-analog converter, comprising:
   a first segment including a first number of first elements that are configured to generate a first analog signal in response to a first portion of a digital signal;
   a second segment including a second number of second elements that are configured to generate a second analog signal in response to a second portion of the digital signal;
   a combiner configured to combine the first analog signal and the second analog signal to generate a resulting analog signal; and
   a controller configured to deactivate one of the first elements and to activate one of the second elements in place of the deactivated one of the first elements.

2. The digital-to-analog converter of claim 1 wherein:
   the first portion of the digital signal includes a quotient of the digital signal divided by an integer; and
   the second portion of the digital signal includes a remainder of the digital signal divided by the integer.

3. The digital-to-analog converter of claim 1 wherein:
   the first portion of the digital signal includes a quotient of the digital signal divided by an integer power of base two; and
   the second portion of the digital signal includes a remainder of the digital signal divided by the integer power of base two.

4. The digital-to-analog converter of claim 1 wherein:
   the first portion of the digital signal has a first range of values; and
   the first number is one less than a number of the values in the first range.

5. The digital-to-analog converter of claim 1 wherein:
   the first portion of the digital signal has maximum value; and
   the first number is equal to the maximum value.

6. The digital-to-analog converter of claim 1 wherein:
   the first portion of the digital signal includes a most-significant portion of the digital signal; and
   the second portion of the digital signal includes a least-significant portion of the digital signal.

7. The digital-to-analog converter of claim 1 wherein each of the first elements has approximately a same gain.

8. The digital-to-analog converter of claim 1 wherein each of the second elements has approximately a same gain.

9. The digital-to-analog converter of claim 1 wherein:
   a first group of the second elements each has approximately a first gain; and
   a second group of the second elements each has approximately a second gain that is different from the first gain.

10. The digital-to-analog converter of claim 1 wherein:
    each of the second elements has a respective gain; and
    each of the first elements has approximately a gain that is approximately an integer multiple of the respective gain of each of the second elements.

11. The digital-to-analog converter of claim 1 wherein the combiner includes a summer configured to generate the resulting analog signal equal to a sum of the first and second analog signals.

12. The digital-to-analog converter of claim 1 wherein:
    the first and second signals respectively include first and second analog currents; and
    the combiner includes a node that is configured to receive the first and second analog currents and to provide the resulting current equal to a sum of the first and second analog currents.

13. The digital-to-analog converter of claim 1 wherein the controller is configured to change, periodically, a correspondence between the first elements and the first portion of the digital signal.

14. The digital-to-analog converter of claim 1 wherein:
    the first portion of the digital signal include at least one digit; and
    the controller is configured to cause each of the first elements to generate a portion of the analog signal corresponding to the at least one digit approximately a same number of times over a period of time.

15. The digital-to-analog converter of claim 1 wherein:
    the first portion of the digital signal include at least one digit; and
    the controller is configured to cause each of the first elements to generate a portion of the analog signal corresponding to the at least one digit approximately a same average number of times.

16. The digital-to-analog converter of claim 1 wherein the controller is configured to deactivate one of the first elements and to activate one of the second elements in place of the deactivated one of the first elements in response to the second portion of the digital signal.

17. An analog-to-digital converter, comprising:
an input node configured to receive an analog input signal;
an output node configured to provide a digital output signal;
a first combiner configured to generate an analog combined signal in response to the analog input signal and an analog feedback signal;
a first filter configured to generate a filtered analog signal in response to the analog combined signal;
a quantizer configured to convert the filtered analog signal into an intermediate digital signal;
a second filter configured to generate the output digital signal in response to the intermediate digital signal; and
a digital-to-analog converter configured to converter the intermediate digital signal into the analog feedback signal, the digital-to-analog converter including
 a first segment including a first number of first elements that are configured to generate a first analog signal in response to a first portion of the intermediate digital signal,
 a second segment including a second number of second elements that are configured to generate a second analog signal in response to a second portion of the intermediate digital signal,
 a second combiner configured to generate the analog feedback signal in response to the first analog signal and the second analog signal, and
 a controller configured to deactivate one of the first elements and to activate one of the second elements in place of the deactivated one of the first elements.

18. The analog-to-digital converter of claim 17 wherein the first combiner is configured to generate an analog combined signal by subtracting the analog feedback signal from the analog input signal.

19. The analog-to-digital converter of claim 17, further comprising:
a sample-and-hold circuit configured to generate a sample of the analog input signal; and
wherein the first combiner is configured to generate the analog combined signal in response to the sample of the analog input signal and then analog feedback signal.

20. A system, comprising:
an analog-to-digital converter, including
 an input node configured to receive an analog input signal,
 an output node configured to provide a digital output signal,
 a first combiner configured to generate an analog combined signal in response to the analog input signal and an analog feedback signal,
 a first filter configured to generate a filtered analog signal in response to the analog combined signal,
 a quantizer configured to convert the filtered analog signal into an intermediate digital signal,
 a second filter configured to generate the output digital signal in response to the intermediate digital signal, and
 a digital-to-analog converter configured to converter the intermediate digital signal into the analog feedback signal, the digital-to-analog converter including
  a first segment including a first number of first elements that are configured to generate a first analog signal in response to a first portion of the intermediate digital signal,
  a second segment including a second number of second elements that are configured to generate a second analog signal in response to a second portion of the intermediate digital signal,
  a second combiner configured to generate the analog feedback signal in response to the first analog signal and the second analog signal, and
  a controller configured to deactivate one of the first elements and to activate one of the second elements in place of the deactivated one of the first elements; and
a control circuit coupled to the analog-to-digital converter.

21. The system of claim 20 wherein the analog-to-digital converter includes a sigma-delta analog-to-digital converter.

22. The system of claim 20 wherein the controller is part of the control circuit.

23. A digital-to-analog converter, comprising:
a first segment including a first number of first elements that are configured to generate a first analog signal in response to a first portion of a digital signal;
a second segment including a second number of second elements that are configured to generate a second analog signal in response to a second portion of the digital signal;
a combiner configured to combine the first analog signal and the second analog signal to generate a resulting analog signal; and
a controller configured to match, dynamically, the first elements.

24. The digital-to-analog converter of claim 23 wherein the controller is configured to match, dynamically, the first elements by data-weight averaging the first elements.

25. The digital-to-analog converter of claim 23 wherein the controller is configured to match, dynamically, the first elements by periodically changing a correspondence between the first elements and the first portion of the digital signal.

26. The digital-to-analog converter of claim 23 wherein the controller is configured to match, dynamically, the first elements by changing a correspondence between the first elements and the first portion of the digital signal in response to the first portion of the digital signal.

27. The digital-to-analog converter of claim 23 wherein:
the first portion of the digital signal includes at least one digit; and
the controller is configured to match, dynamically, the first elements by causing each of the first elements to generate a portion of the analog signal corresponding to the at least one digit approximately a same number of times over a period of time.

28. The digital-to-analog converter of claim 23 wherein:
the first portion of the digital signal include at least one digit; and
the controller is configured to match, dynamically, the first elements by causing each of the first elements to generate a portion of the analog signal corresponding to the at least one digit approximately a same average number of times.

29. An analog-to-digital converter, comprising:
an input node configured to receive an analog input signal;
an output node configured to provide a digital output signal;
a first combiner configured to generate an analog combined signal in response to the analog input signal and an analog feedback signal;
a first filter configured to generate a filtered analog signal in response to the analog combined signal;
a quantizer configured to convert the filtered analog signal into an intermediate digital signal;

a second filter configured to generate the output digital signal in response to the intermediate digital signal; and a digital-to-analog converter configured to converter the intermediate digital signal into the analog feedback signal, the digital-to-analog converter including a first segment including a first number of first elements that are configured to generate a first analog signal in response to a first portion of the intermediate digital signal, a second segment including a second number of second elements that are configured to generate a second analog signal in response to a second portion of the intermediate digital signal, a combiner configured to combine the first analog signal and the second analog signal to generate the feedback analog signal, and a controller configured to match, dynamically, the first elements.

30. A system, comprising:

an analog-to-digital converter, including an input node configured to receive an analog input signal;

an output node configured to provide a digital output signal;

a first combiner configured to generate an analog combined signal in response to the analog input signal and an analog feedback signal;

a first filter configured to generate a filtered analog signal in response to the analog combined signal;

a quantizer configured to convert the filtered analog signal into an intermediate digital signal;

a second filter configured to generate the output digital signal in response to the intermediate digital signal; and a digital-to-analog converter configured to converter the intermediate digital signal into the analog feedback signal, the digital-to-analog converter including a first segment including a first number of first elements that are configured to generate a first analog signal in response to a first portion of the intermediate digital signal, a second segment including a second number of second elements that are configured to generate a second analog signal in response to a second portion of the intermediate digital signal, a combiner configured to combine the first analog signal and the second analog signal to generate the feedback analog signal, and a controller configured to match, dynamically, the first elements; and a control circuit coupled to the analog-to-digital converter.

31. The system of claim 30 wherein the analog-to-digital converter includes a sigma-delta analog-to-digital converter.

32. The system of claim 30 wherein the controller is part of the control circuit.

33. A method, comprising:

generating a first analog signal with a first digital-to-analog converter in response to a first portion and a second portion of a digital signal;

generating a second analog signal with a second digital-to-analog converter in response to the second portion of the digital signal; and combining the first and second analog signals to generate an output analog signal.

34. The method of claim 33 wherein generating the first analog signal includes deactivating a portion of the first digital-to-analog converter in response to the second portion of the digital signal.

35. The method of claim 33 wherein generating the first analog signal includes activating a portion of the first digital-to-analog converter in response to the second portion of the digital signal.

36. The method of claim 33 wherein generating the second analog signal includes generating the second analog signal in response to the first portion of the digital signal.

37. The method of claim 33 wherein:

generating the first analog signal includes deactivating a portion of the first digital-to-analog converter a first number of times out of each second number of times that the second portion of the digital signal has a value; and generating the second analog signal includes activating a portion of the second digital-to-analog converter the first number of times out of each second number of times that the second portion of the digital signal has the value.

38. The method of claim 37 wherein the first number is one and the second number is two.

39. The method of claim 37 wherein the first number is three and the second number is four.

40. The method of claim 37 wherein the first number is two and the second number is four.

41. The method of claim 37 wherein the first number is one and the second number is four.

42. The method of claim 37 wherein the first number is zero and the second number is four.

43. A method, comprising:

activating each of first digital-to-analog-converter elements approximately a same average number of times in response to a first portion of a digital signal to generate a first analog signal;

activating second digital-to-analog-converter elements in response to a second portion of the digital signal to generate a second analog signal;

combining the first analog signal and the second analog signal to generate a resulting analog signal.

44. The method of claim 43, further comprising activating the first digital-to-analog-converter elements in response to the second portion of the digital signal.

* * * * *